(12) United States Patent
Lochtefeld

(10) Patent No.: US 8,765,510 B2
(45) Date of Patent: Jul. 1, 2014

(54) SEMICONDUCTOR DIODES FABRICATED BY ASPECT RATIO TRAPPING WITH COALESCED FILMS

(71) Applicant: Taiwan Semiconductor Manufacturing Company, Ltd., Hsin-Chu (TW)

(72) Inventor: Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/650,206

(22) Filed: Oct. 12, 2012

(65) Prior Publication Data

US 2013/0034924 A1 Feb. 7, 2013

Related U.S. Application Data

(62) Division of application No. 12/684,499, filed on Jan. 8, 2010, now Pat. No. 8,304,805.

(60) Provisional application No. 61/143,602, filed on Jan. 9, 2009.

(51) Int. Cl.
*H01L 21/66* (2006.01)

(52) U.S. Cl.
USPC .......... 438/47; 438/22; 438/44; 438/94; 438/E31.005; 257/94; 257/101; 257/103; 257/E33.106

(58) Field of Classification Search
USPC .......... 438/47–48, 50–52, 22; 257/14–16, 79, 257/86, 88, 94, 96, 103, 101, 431, 458, 461, 257/E33.008, E33.032, E29.328, E39.339, 257/E29.336
See application file for complete search history.

(56) References Cited

U.S. PATENT DOCUMENTS

| | | | |
|---|---|---|---|
| 4,307,510 A | 12/1981 | Sawyer et al. |
| 4,322,253 A | 3/1982 | Pankove et al. |
| 4,370,510 A | 1/1983 | Stirn |
| 4,545,109 A | 10/1985 | Reichert |
| 4,551,394 A | 11/1985 | Betsch et al. |
| 4,651,179 A | 3/1987 | Reichert |
| 4,727,047 A | 2/1988 | Bozler et al. |

(Continued)

FOREIGN PATENT DOCUMENTS

| | | |
|---|---|---|
| DE | 10017137 | 10/2000 |
| DE | 10320160 | 8/2004 |

(Continued)

OTHER PUBLICATIONS

68 Applied Physics Letters 7, 1999, pp. 774-779 (trans. of relevant portions attached).

(Continued)

*Primary Examiner* — Dung A. Le
(74) *Attorney, Agent, or Firm* — Slater and Matsil, L.L.P.

(57) ABSTRACT

A photonic device comprises a substrate and a dielectric material including two or more openings that expose a portion of the substrate, the two or more openings each having an aspect ratio of at least 1. A bottom diode material comprising a compound semiconductor material that is lattice mismatched to the substrate occupies the two or more openings and is coalesced above the two or more openings to form the bottom diode region. The device further includes a top diode material and an active diode region between the top and bottom diode materials.

20 Claims, 20 Drawing Sheets

(56) References Cited

U.S. PATENT DOCUMENTS

| | | | |
|---|---|---|---|
| 4,774,205 A | 9/1988 | Choi et al. |
| 4,789,643 A | 12/1988 | Kajikawa |
| 4,826,784 A | 5/1989 | Salerno et al. |
| 4,860,081 A | 8/1989 | Cogan |
| 4,876,210 A | 10/1989 | Barnett et al. |
| 4,948,456 A | 8/1990 | Schubert |
| 4,963,508 A | 10/1990 | Umeno et al. |
| 5,032,893 A | 7/1991 | Fitzgerald, Jr. et al. |
| 5,034,337 A | 7/1991 | Mosher et al. |
| 5,061,644 A | 10/1991 | Yue et al. |
| 5,079,616 A | 1/1992 | Yacobi et al. |
| 5,091,333 A | 2/1992 | Fan et al. |
| 5,091,767 A | 2/1992 | Bean et al. |
| 5,093,699 A | 3/1992 | Weichold et al. |
| 5,098,850 A | 3/1992 | Nishida et al. |
| 5,105,247 A | 4/1992 | Cavanaugh |
| 5,108,947 A | 4/1992 | Demeester et al. |
| 5,156,995 A | 10/1992 | Fitzgerald, Jr. et al. |
| 5,159,413 A | 10/1992 | Calviello et al. |
| 5,164,359 A | 11/1992 | Calviello et al. |
| 5,166,767 A | 11/1992 | Kapoor et al. |
| 5,223,043 A | 6/1993 | Olson et al. |
| 5,236,546 A | 8/1993 | Mizutani |
| 5,238,869 A | 8/1993 | Shichijo et al. |
| 5,256,594 A | 10/1993 | Wu et al. |
| 5,269,852 A | 12/1993 | Nishida |
| 5,269,876 A | 12/1993 | Mizutani |
| 5,272,105 A | 12/1993 | Yacobi et al. |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,356,831 A | 10/1994 | Calviello et al. |
| 5,403,751 A | 4/1995 | Nishida et al. |
| 5,405,453 A | 4/1995 | Ho et al. |
| 5,407,491 A | 4/1995 | Freundlich et al. |
| 5,410,167 A | 4/1995 | Saito |
| 5,417,180 A | 5/1995 | Nakamura |
| 5,427,976 A | 6/1995 | Koh et al. |
| 5,432,120 A | 7/1995 | Meister et al. |
| 5,438,018 A | 8/1995 | Mori et al. |
| 5,461,243 A | 10/1995 | Ek et al. |
| 5,518,953 A | 5/1996 | Takasu |
| 5,528,209 A | 6/1996 | MacDonald et al. |
| 5,545,586 A | 8/1996 | Koh |
| 5,589,696 A | 12/1996 | Baba |
| 5,621,227 A | 4/1997 | Joshi |
| 5,622,891 A | 4/1997 | Saito |
| 5,640,022 A | 6/1997 | Inai |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,825,240 A | 10/1998 | Geis et al. |
| 5,849,077 A | 12/1998 | Kenney |
| 5,869,845 A | 2/1999 | Vander Wagt et al. |
| 5,883,549 A | 3/1999 | De Los Santos |
| 5,886,385 A | 3/1999 | Arisumi et al. |
| 5,903,170 A | 5/1999 | Kulkarni et al. |
| 5,953,361 A | 9/1999 | Borchert et al. |
| 5,959,308 A | 9/1999 | Shichijo et al. |
| 5,966,620 A | 10/1999 | Sakaguchi et al. |
| 5,998,781 A | 12/1999 | Vawter et al. |
| 6,011,271 A | 1/2000 | Sakuma et al. |
| 6,015,979 A | 1/2000 | Sugiura et al. |
| 6,049,098 A | 4/2000 | Sato |
| 6,083,598 A | 7/2000 | Ohkubo et al. |
| 6,100,106 A | 8/2000 | Yamaguchi et al. |
| 6,110,813 A | 8/2000 | Ota et al. |
| 6,111,288 A | 8/2000 | Watanabe et al. |
| 6,150,242 A | 11/2000 | Van der Wagt et al. |
| 6,153,010 A | 11/2000 | Kiyoku et al. |
| 6,191,432 B1 | 2/2001 | Sugiyama et al. |
| 6,225,650 B1 | 5/2001 | Tadatomo et al. |
| 6,228,691 B1 | 5/2001 | Doyle |
| 6,229,153 B1 | 5/2001 | Botez et al. |
| 6,235,547 B1 | 5/2001 | Sakuma et al. |
| 6,252,261 B1 | 6/2001 | Usui et al. |
| 6,252,287 B1 | 6/2001 | Kurtz et al. |
| 6,271,551 B1 | 8/2001 | Schmitz et al. |
| 6,274,889 B1 | 8/2001 | Ota et al. |
| 6,300,650 B1 | 10/2001 | Sato |
| 6,320,220 B1 | 11/2001 | Watanabe et al. |
| 6,339,232 B1 | 1/2002 | Takagi |
| 6,342,404 B1 | 1/2002 | Shibata et al. |
| 6,348,096 B1 | 2/2002 | Sunakawa et al. |
| 6,352,942 B1 | 3/2002 | Luan et al. |
| 6,362,071 B1 | 3/2002 | Nguyen et al. |
| 6,403,451 B1 | 6/2002 | Linthicum et al. |
| 6,407,425 B1 | 6/2002 | Babcock et al. |
| 6,456,214 B1 | 9/2002 | Van der Wagt |
| 6,458,614 B1 | 10/2002 | Nanishi et al. |
| 6,492,216 B1 | 12/2002 | Yeo et al. |
| 6,503,610 B2 | 1/2003 | Hiramatsu et al. |
| 6,512,252 B1 | 1/2003 | Takagi et al. |
| 6,521,514 B1 | 2/2003 | Gehrke et al. |
| 6,552,259 B1 | 4/2003 | Hosomi et al. |
| 6,566,284 B2 | 5/2003 | Thomas, III et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,606,335 B1 | 8/2003 | Kuramata et al. |
| 6,617,643 B1 | 9/2003 | Goodwin-Johansson |
| 6,635,110 B1 | 10/2003 | Luan et al. |
| 6,645,295 B1 | 11/2003 | Koike et al. |
| 6,645,797 B1 | 11/2003 | Buynoski et al. |
| 6,686,245 B1 | 2/2004 | Mathew et al. |
| 6,703,253 B2 | 3/2004 | Koide |
| 6,709,982 B1 | 3/2004 | Buynoski et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,756,611 B2 | 6/2004 | Kiyoku et al. |
| 6,784,074 B2 | 8/2004 | Shchukin et al. |
| 6,803,598 B1 | 10/2004 | Berger et al. |
| 6,809,351 B2 | 10/2004 | Kuramoto et al. |
| 6,812,495 B2 | 11/2004 | Wada et al. |
| 6,815,241 B2 | 11/2004 | Wang |
| 6,825,534 B2 | 11/2004 | Chen et al. |
| 6,831,350 B1 | 12/2004 | Liu et al. |
| 6,835,246 B2 | 12/2004 | Zaidi |
| 6,835,618 B1 | 12/2004 | Dakshina-Murthy et al. |
| 6,841,410 B2 | 1/2005 | Sasaoka |
| 6,841,808 B2 | 1/2005 | Shibata et al. |
| 6,849,077 B2 | 2/2005 | Ricci |
| 6,855,583 B1 | 2/2005 | Krivokapic et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,882,051 B2 | 4/2005 | Majumdar et al. |
| 6,887,773 B2 | 5/2005 | Gunn, III et al. |
| 6,900,070 B2 | 5/2005 | Craven et al. |
| 6,902,965 B2 | 6/2005 | Ge et al. |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,946,683 B2 | 9/2005 | Sano et al. |
| 6,951,819 B2 | 10/2005 | Iles et al. |
| 6,955,977 B2 | 10/2005 | Kong et al. |
| 6,958,254 B2 | 10/2005 | Seifert |
| 6,960,781 B2 | 11/2005 | Currie et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,996,147 B2 | 2/2006 | Majumdar et al. |
| 6,998,684 B2 | 2/2006 | Anderson et al. |
| 7,001,804 B2 | 2/2006 | Dietz et al. |
| 7,002,175 B1 | 2/2006 | Singh et al. |
| 7,012,298 B1 | 3/2006 | Krivokapic |

(56) References Cited

U.S. PATENT DOCUMENTS

| | | |
|---|---|---|
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,049,627 B2 | 5/2006 | Vineis et al. |
| 7,074,623 B2 | 7/2006 | Lochtefeld et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,088,143 B2 | 8/2006 | Ding et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,119,402 B2 | 10/2006 | Kinoshita et al. |
| 7,122,733 B2 | 10/2006 | Narayanan et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,145,167 B1 | 12/2006 | Chu |
| 7,154,118 B2 | 12/2006 | Lindert et al. |
| 7,160,753 B2 | 1/2007 | Williams, Jr. |
| 7,179,727 B2 | 2/2007 | Capewell et al. |
| 7,195,993 B2 | 3/2007 | Zheleva et al. |
| 7,205,586 B2 | 4/2007 | Takagi et al. |
| 7,211,864 B2 | 5/2007 | Seliskar |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,297,569 B2 | 11/2007 | Bude et al. |
| 7,344,942 B2 | 3/2008 | Korber |
| 7,372,066 B2 | 5/2008 | Sato et al. |
| 7,420,201 B2 | 9/2008 | Langdo et al. |
| 7,449,379 B2 | 11/2008 | Ochimizu et al. |
| 7,582,498 B2 | 9/2009 | D'Evelyn et al. |
| 7,626,246 B2 | 12/2009 | Lochtefeld et al. |
| 7,655,960 B2 | 2/2010 | Nakahata et al. |
| 7,777,250 B2 | 8/2010 | Lochtefeld |
| 8,502,263 B2 * | 8/2013 | Li et al. .................... 257/103 |
| 2001/0006249 A1 | 7/2001 | Fitzgerald |
| 2001/0045604 A1 | 11/2001 | Oda et al. |
| 2002/0011612 A1 | 1/2002 | Hieda |
| 2002/0017642 A1 | 2/2002 | Mizushima et al. |
| 2002/0022290 A1 | 2/2002 | Kong et al. |
| 2002/0030246 A1 | 3/2002 | Eisenbeiser et al. |
| 2002/0036290 A1 | 3/2002 | Inaba et al. |
| 2002/0046693 A1 | 4/2002 | Kiyoku et al. |
| 2002/0066403 A1 | 6/2002 | Sunakawa et al. |
| 2002/0070383 A1 | 6/2002 | Shibata et al. |
| 2002/0084000 A1 | 7/2002 | Fitzgerald |
| 2002/0127427 A1 | 9/2002 | Young et al. |
| 2002/0168802 A1 | 11/2002 | Hsu et al. |
| 2002/0168844 A1 | 11/2002 | Kuramoto et al. |
| 2002/0179005 A1 | 12/2002 | Koike et al. |
| 2003/0045017 A1 | 3/2003 | Hiramatsu et al. |
| 2003/0057486 A1 | 3/2003 | Gambino et al. |
| 2003/0064535 A1 | 4/2003 | Kub et al. |
| 2003/0070707 A1 | 4/2003 | King et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0003572 A1 | 1/2005 | Hahn et al. |
| 2005/0009304 A1 | 1/2005 | Zheleva et al. |
| 2005/0035410 A1 | 2/2005 | Yeo et al. |
| 2005/0045983 A1 | 3/2005 | Noda et al. |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0104156 A1 | 5/2005 | Wasshuber |
| 2005/0118825 A1 | 6/2005 | Nishijima et al. |
| 2005/0121688 A1 | 6/2005 | Nagai et al. |
| 2005/0136626 A1 | 6/2005 | Morse |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0166437 A1 | 7/2006 | Korber |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0266281 A1 | 11/2006 | Beaumont et al. |

(56) References Cited

U.S. PATENT DOCUMENTS

| | | |
|---|---|---|
| 2006/0267047 A1 | 11/2006 | Murayama |
| 2006/0292719 A1 | 12/2006 | Lochtefeld et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0099315 A1 | 5/2007 | Maa et al. |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0187018 A1 | 8/2008 | Li |
| 2008/0194078 A1 | 8/2008 | Akiyama et al. |
| 2008/0257409 A1 | 10/2008 | Li et al. |
| 2008/0286957 A1 | 11/2008 | Lee et al. |
| 2009/0039361 A1 | 2/2009 | Li et al. |
| 2009/0065047 A1 | 3/2009 | Fiorenza et al. |
| 2009/0072284 A1 | 3/2009 | King et al. |
| 2009/0110898 A1 | 4/2009 | Levy et al. |
| 2009/0321882 A1 | 12/2009 | Park |
| 2010/0213511 A1 | 8/2010 | Lochtefeld |
| 2010/0308376 A1 | 12/2010 | Takada et al. |

FOREIGN PATENT DOCUMENTS

| | | |
|---|---|---|
| EP | 0352473 | 6/1989 |
| GB | 2215514 | 9/1989 |
| JP | 2002062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| KR | 20030065631 | 8/2003 |
| KR | 20090010284 | 1/2009 |
| TW | 544930 | 8/2003 |
| WO | WO0101465 | 1/2001 |
| WO | WO02086952 | 10/2002 |
| WO | WO2005048330 | 5/2005 |
| WO | WO2005122267 | 12/2005 |
| WO | WO2006125040 | 11/2006 |

OTHER PUBLICATIONS

Asano et al., "AlGaInN laser diodes grown on an ELO-GaN substrate vs. on a sapphire substrate," Semiconductor Laser Conference (2000) Conference Digest, IEEE 17th International, 2000, pp. 109-110.

Ashby, et al., "Low-dislocation-density GaN from a single growth on a textured substrate," Applied Physics Letters, vol. 77, No. 20, Nov. 13, 2000, pp. 3233-3235.

Bakkers et al., "Epitaxial Growth on InP Nanowires on Germanium," Nature Materials, vol. 3, Nov. 2004, pp. 769-773.

Baron et al., "Chemical Vapor Deposition of Ge Nanocrystals on $SiO_2$," Applied Physics Letters, vol. 83, No. 7, Aug. 18, 2003, pp. 1444-1446.

Bean et al., "$Ge_xSi_{1-x}$/Si strained-later Superlattice grown by molecular beam Epitaxy," Journal of Vacuum Science Technology A2 (2), Jun. 1984, pp. 436-440.

Beckett et al., "Towards a reconfigurable nanocomputer platform," ACM International Conference Proceeding Series, vol. 19, 2002, pp. 141-150.

Beltz et al., "A Theoretical Model for Threading Dislocation Reduction During Selective Area Growth," Materials Science and Engineering, A234-236, 1997, pp. 794-797.

Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.

Blakeslee, "The Use of Superlattices to Block the Propagation of Dislocations in Semiconductors," Mat. Res. Soc. Symposium Proceedings 148, 1989, pp. 217-227.

Borland, "Novel Device structures by selective epitaxial growth (SEG)," Electron Devices Meeting, vol. 33, 1987, pp. 12-15.

Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.

Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.

Cannon et al., "Monolithic Si-based Technology for Optical Receiver Circuits," Proceedings of SPIE, vol. 4999, 2003, pp. 145-155.

Chan et al., "Influence of Metalorganic Sources on the Composition Uniformity of Selectively Grown $Ga_xIn_{1-x}P$," Japan. Journal of Applied Physics, vol. 33, 1994, pp. 4812-4819.

Yamaguchi et al., GaAs Solar Cells Grown on Si Substrates for Space Use: Prog. Photovolt.: Res. Appl., vol. 9, 2001; pp. 191-201.

Yamaguchi et al., "Super-High-Efficiency Multi-junction Solar Cells," Prog. Photovolt.: Res. Appl., vol. 13, 2005, pp. 125-132.

Chang et al., "Epitaxial Lateral Overgrwoth of Wide Dislocation-Free GaAs on Si Substrates," Electrochemical Scoiety Proceedings, vol. 97-21, May 13, 1998, pp. 196-200.

Chang et al., "Effect of growth temperature on epitaxial lateral overgrowth of GaAs on Si substrate," Journal of Crystal Growth, vol. 174, No. 1-4, Apr. 1997, pp. 630-634.

Chau et al., Opportunities and Challenges of III-V Nanoelectronics for Future High-Speed, Low Power Logic Applications, IEEE SCIC Digest, 2005, pp.7-20.

Chen et al., "Dislocation reduction in GaN thin films vial lateral overgrowth from trenches," Applied Physics Letters, vol. 75, No. 14, Oct. 4, 1999, pp. 2062-2063.

Choi et al., "Monolithic Integration GaAs/AlGaAs LED and Si Driver Circuit," 9 Electron Device Letters 10, Oct. 1998, 3 pages.

Choi et al., "Monolithic Integration of GaAs/AlGaAs Double-Heterostructure LEDs and Si MOSFETs," Electron Device Letters, vol. EDL-7, No. 9, Sep. 1986, 3 pages.

Choi et al., "Monolithic Integration of Si MOSFETs and GaAs MESFETs," Electron Device Letters, vol. EDL-7, No. 4, Apr. 1986, 3 pages.

Cloutier et al., "Optical gain and stimulated emission in periodic nanopatterned crystalline silicon," Nature Materials, Nov. 2005, 5 pages.

Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.

Dadgar et al., "MOVPE growth of GaN on Si (111) substrates," Journal of Crystal Growth, vol. 248, Feb. 1, 2003, pp. 556-562.

Datta et al., "Silicon and III-V Nanoelectronics," IEEE International Conference on Indium Phosphide & Related Materials, 2005, pp. 7-8.

Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.

(56) References Cited

OTHER PUBLICATIONS

De Boeck et al., "The fabrication on a novel composite GaAs/SiO$_2$ nucleation layer on silicon for heteroepitaxial overgrowth by molecular beam Epitaxy," Material Science and Engineering, B9, 1991, pp. 137-141.
Donation et al., "Design and Fabrication of MOSFETs with a Reverse Embedded SiGe (Rev. e-SiGe) Structure," 2006 IEDM, pp. 465-468.
Dong, Y., et al, "Selective area growth of InP through narrow openings by MOCVD and its application to InP HBT," 2003 International Conference on Indium Phosphide and Related Materials, May 12-16, 2003, pp. 389-392.
Kim, et al., "GaN nano epitaxial overgrowth on holographically patterned," Compound Semiconductors, International Symposium, Aug. 25-27, 2003, pp. 27-28.
Yamaguchi et al, "Defect Reduction Effects in GaAs on Si Substrates by Thermal Annealing," Applied Physics Letters vol. 53, No. 23, 1998, pp. 2293.
Ujiie, et al., Epitaxial Lateral Overgrowth of GaAs on a Si Substrate, 28, Japan, Journal of Applied Physics, vol. 3, Mar. 19889, pp. L337-L339.
Examination Report in European Patent Application No. 06800414.2 mailed Mar. 5, 2009, 3 pages.
Fang et al., "electrically pumped hybrid AlGaInAs-silicon evanescent laser," 14 Optics Express 20, 2006, pp. 9203-9210.
Feltin et al., "epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon CMOS," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers," Phys. Stat. Sol. (a) vol. 171, 1999, pp. 475-485.
Fitzgerald et al., "Elimination of Dislocations in Heteroepitaxial MBE and RTCVD Ge$_x$Si$_{1-x}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimiination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1998, pp. 693-703.
Fitzgerald et al., "Totally relaxed Ge$_x$Si$_{1-x}$ layers with low threading dislocation densities grown on Si substrates," vol. 59, Applied Physics Letters 7, 1991, pp. 811-813.
Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16-Mb MRAM demonstrator chip," 50 IBM J. Research & Dev. Jan. 1, 2006, pp. 5-23A.
Gallas et al., "Influence of Doping on Facet Formation at the SiO$_2$/Si Interface," Surface Sci. 440, 1999, pp. 41-48.
Geppert, "Quantum transistors: toward nanoelectronics," IEEE Spectrum, Sep. 2000, pp. 46-51.
Xu et al., "Spin-Filter Devices Based on Resonant Tunneling Antisymmetrical Magnetic Semiconductor Hybrid Structures," vol. 84, Applied Physics Letters 11, 2004, pp. 1955-1957.
Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.
Gould et al., "Magnetic resonant tunneling diodes as voltage-controlled spin selectors," 241 Phys. Stat. Sol. (B), vol. 3, 2004, pp. 700-703.
Groenert et al., "Monolithic integration of room-temperature cw GaAs/AlGaAs lasers on Si substrate via relaxed graded GeSi buffer layers," 93 Journal of Applied Physics, No. 362, Jan. 2003, pp. 362-367.
Gustafsson et al., "Cathodoluminescence from relazed Ge$_x$Si$_{1-x}$ grown by heteroepitaxial lateral overgrowth," Journal of Crystal Growth 141, 1994, pp. 363-370.
Gustafsson et al., "Investigations of high quality Ge$_x$Si$_{1-x}$ grown by heteroepitaxial lateral overgrowth using cathodoluminescence," Inst. Phys. Conf. Ser., No. 134, Section 11, Apr. 1993, pp. 675-678.
Hayafuji et al., Japan, Journal of Applied Physics, vol. 29, 1990, pp. 2371.
Hersee et al., "The Controlled Growth of GaN Nanowires," Nano Letters, vol. 6, No. 8, 2006, pp. 1808-1811.
Hiramatsu et al., "Fabrication and characterization of low defect density GaN using facet-controlled epitaxial lateral overgrowth (FACELO)," Journal of Crystal Growth, vol. 221, Dec. 2000, pp. 316-326.
Hollander et al., "Strain and Misfit Dislocation Density in Finite Lateral Size Si$_{1-x}$Ge$_x$/Si Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Physics Letters 19, 2001, 3 pages.
Huang et al., "Electron and Hole Mobility Enhancement in Strained SOI by Wafer Bonding," 49 IEEE Transactions on Electron Devices 9, 2002, pp. 1566-1570.
International Preliminary Report on Patentability for International Application No. PCT/US07/020777 mailed Apr. 9, 2009 and International Search Report and Written Opinion mailed Feb. 8, 2008, 30 pages.
International Preliminary Report on Patentability for International Application No. PCT/US07/021023 mailed Apr. 9, 2009, 8 pages.
International Preliminary Report on Patentability for International Application No. PCT/US07/022392 mailed Apr. 30, 2009 and International Search Report & Written Opinion mailed Apr. 11, 2008, 34 pages.
International Preliminary Report on Patentability for International Application No. PCT/US2006/019152, mailed Nov. 29, 2007 and International Search Report and Written Opinion mailed Oct. 19, 2006, 13 pages.
Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-3.
Xie et al., "From Porous Si to Patterned Si Substrate: Can Misfit Strain Energy in a Continuous Heteropitaxial Film Be Reduced?" Journal of Vacuum Science Technology, B, vol. 8, No. 2, Mar./Apr. 1990, pp. 227-231.
International Preliminary Report on Patentability for International Application No. PCT/US2007/019568, mailed Mar. 19, 2009 and International Search Report and Written Opinion mailed Feb. 6, 2008, 20 pages.
International Preliminary Report on Patentability for International Application No. PCT/US2007/020181, mailed Apr. 2, 2009 and International Search Report and Written Opinion mailed Jan. 25, 2008, 24 pages.
International Preliminary Report on Patentability for International Application No. PCT/US06/033859 mailed Mar. 20, 2008 and International Search Report and Written Opinion mailed Sep. 12, 2007 and partial International Search mailed Jun. 22, 2007, 43 pages.
International Search Report & Written Opinion for International Application No. PCT/US2008/068377, mailed Jul. 6, 2009 and Partial International Search Report mailed Apr. 7, 2009, 26 pages.

(56) References Cited

OTHER PUBLICATIONS

International Search Report and Written Opinion for International Application No. PCT/US2007/007373, dated Oct. 5, 2007, 13 pages.

International Preliminary Report on Patentability for PCT/US2006/029247 mailed Feb. 7, 2008 and International Search Report and Written Opinion mailed May 7, 2007, 31 pages.

International Technology Roadmap for Semiconductors—Front End Processes, pp. 1-62 (2005).

Ipri et al., "MONO/POLY technology for fabricating low-capacitance CMOS integrated circuits," Electron Devices, IEEE Transactions, vol. 35, No. 8, Aug. 1988 pp. 1382-1383.

Yoshizawa et al., "Growth of self-Organized GaN Nanostructures on Al 2O3 (0001) by RF-Radial Source Molecular Beam Epitaxy", Japan, Journal of Applied Physics, Part 2, vol. 36, No. 4B, 1997, pp. L459-L462.

Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.

Kawai, et al., "Epitaxial Growth of InN Films and InN Nano-Columns by RF-MBE," The Institute of Electronics, Information and Communication Engineers, Gijutsu Kenkyu, vol. 13, No. 343 (CMP2003 102-116), 2003, pp. 33-37.

Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194.

Cchang et al. "3-D simulation of strained Si/SiGe heterojunction FinFETs" Semiconductor Device Research Symposium, Dec. 10-12, 2003, pp. 176-177.

Burenkov et al., "Corner Effect in Double and Triple Gate FinFETs" European solid-state device research, 33rd Conference on Essderc '03 Sep. 16-18, 2003, Piscataway, NJ, USA, IEEE, vol. 16, pp. 135-138, XPo10676716.

Examination Report in European Patent Application No. 06800414.2, mailed Mar. 5, 2009, 3 pages.

Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.

Wernersson et al., "InAs Epitaxial Lateral Growth of W Marks," Journal of Crystal Growth, vol. 280, 2005, pp. 81-86.

Ishitani et al., "Facet Formation in Selective Silicon Epitaxial Growth," 24 Japan, Journal of Applied Physics, vol. 10, 1985, pp. 1267-1269.

Ismail et al., "High-quality GaAs on Sawtooth-patterned Si Substrates," 59 Applied Physics Letters 19, 1991, pp. 2418-2420.

Jain et al., "Stresses in strained GeSi stripes and quantum structures: calculation using the finite element method and determination using micro-Raman and other measurements," Thin Solid Films 292, 1997, pp. 218-226.

Wang, et al., "Fabrication of patterned sapphire substrate by wet chemical etching for maskless lateral overgrowth of GaN," Journal of the Electrochemical Society, vol. 153, No. 3, Mar. 2006, pp. C182-C185.

Ju et al., "Epitaxial lateral overgrowth of gallium nitride on silicon substrate," Journal of Crystal Growth, vol. 263, No. 1-4, Mar. 1, 2004, pp. 30-34.

Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.

Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.

Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.

Kidoguchi et al., "Air-bridged lateral epitaxial overgrowth on GaN thin Films," Applied Physics Letters, vol. 76, No. 25, Jun. 19, 2000, pp. 3768-3770.

Kimura et al., "Vibronic Fine Structure Found in the Blue Luminescence from Silicon Nanocolloids," Japan, Journal of Applied Physica, vol. 38, 1999, pp. 609-612.

Klapper, "Gneneration and Propagation of Dislocations During Crystal Growth," Mat. Chem. and Phys. vol. 66, 2000, pp. 101-109.

Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.

Krost et al., "GaN-based Optoelectronics on Silicon Substrates," Materials Science & Engineering, B93, 2002, pp. 77-84.

Kushida et al., "Epitaxial growth of $PbTiO_3$ films on $SrTiO_3$ by RF magnetron sputtering," Ultrasonics, Ferroelectrics and Frequency Control, IEEE Transactions on Ultrasonics Ferroelectrics and Frequency Control, vol. 38, No. 6, Nov. 1991, pp. 656-662.

Kwok, "Complete Guide to Semiconductor Devices," $2^{nd}$ ed., Chapter 18, 2002, pp. 137-144.

Vescan et al., "Lateral Confinement by Low Pressure Chemical Vapor Deposition-Based Selective Epitaxial Growth of $Si_{1-x}Ge_x$/Si Nanostructures," No. 81, Journal of Applied Physics 10, 1997, pp. 6709-6715.

Ventury et al., "First Demonstration of AlGaN/GaN Heterostructure Field Effect Transistor on GaN Grown by Lateral Epitaxial Overgrowth (ELO)," Inst. Phys. Conf. Ser. No. 162: Ch. 5, Oct. 1998, pp. 177-183.

Langdo et al., "High Quality Ge on Si by Epitaxial Necking," Applied Physics Letters, vol. 76, No. 25, Jun. 19, 2000, pp. 3700-3702.

Langdo, "Selective SiGe Nanostructures," PhD Thesis, Massachusetts Institute of Technology, Jun. 2001, 215 pages.

Lee et al., "Strain-relieved, Dislocation-free $In_xGa_{1-x}As$/GaAs(001) Heterostructure by Nanoscale-patterned Growth," Applied Physics Letters, vol. 85, No. 18, Nov. 1, 2004, pp. 4181-4183.

Lee et al., "Growth on GaN on a nanoscale periodic faceted Si substrate by metal organic vapor phase epitaxy," Compound Semiconductors: Post-Conference Proceedings, Aug. 25-27, 2003, pp. 15-21.

Li et al., "Heteroepitaxy of High-quality Ge on Si by Nanoscale Ge seeds Grown through a Thin Layer of $SiO_2$," Applied Physics Letters, vol. 85, No. 11, Sep. 13, 2004, pp. 1928-1930.

Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.

Li et al., "Selective Growth of Ge on Si (100) through Vias of $SI_{02}$ Nanotemplate Using Solid Source Molecular Beam Epitaxy," Applied Physics Letters, vol. 83, No. 24, Dec. 15, 2003, pp. 5032-5034.

Liang et al., "Critical Thickness enhancement of Epitaxial SiGe films Grown on Small Structures," Journal of Applied Physics, vol. 97, 2005, pp. 043519-1-043519-7.

Lim et al., "Facet Evolution in Selective Epitaxial Growth of Si by cold-wall ultrahigh vacuum chemical vapor deposition," Journal of Vac. Sci. Tech., vol. B 22, No. 2, 2004, pp. 682.

Liu et al., "High Quality Single-crystal Ge on Insulator by Liquid-phase Epitaxy on Si Substrates," Applied Physics Letters, vol. 84, No. 14, Apr. 4, 2004, pp. 2563-2565.

Liu et al., "Rapid Melt Growth of Germanium Crystals with Self Aligned Microcrucibles on Si Substrates," Journal of the Electrochemical Society, vol. 152, No. 8, 2005, pp. G688-G693.

Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.

Lourdudoss et al., "Semi-insulating epitaxial layers for optoelectronic devices," Semiconducting and Insulating Materials Conference, SIMC-XI, 2000, pp. 171-178.

Luan et al., "High-quality Ge Epilayers on Si with Low Threading-dislocation Densities," Applied Physics Letters, vol. 75, No. 19, Nov. 8, 1999, pp. 2909-2911.

Luan, "Ge Photodetectors for Si Microphotonics," PhD Thesis, Massachusetts Institute of Technology, Department of Materials Science & Engineering, Jan. 12, 2001, 155 pages.

(56) References Cited

OTHER PUBLICATIONS

Lubnow et al., "Effect of III/V-Compound Epitaxy on Si Metal-Oxide-Semiconductor Circuits," Japan, Journal of Applied Physics, vol. 33, 1994, pp. 3628-3634.
Vanamu et al., "Heteroepitaxial Growth on Microscale Patterned Silicon Structures," Journal of Crystal Growth, vol. 280, 2005, pp. 66-74.
Vanamu et al., "Improving Ge $Si_xGE_{1-x}$ Film Quality through Growth onto Patterned Silicon Substrates," Advances in Electronics Manufacturing Technology, Nov. 8, 2004, pp. 1-4.
Luryi et al., "New Approach to the High Quality Epitaxial Growth of Latticed-Mismatched Materials," Applied Physics Letters, vol. 49, No. 3, Jul. 21, 1986, pp. 140-142.
Martinez et al., "characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.
Matsunaga et al., "A New Way to Achieve Dislocation-Free Heteroepitaxial Growth by Molecular Beam Epitaxy: Vertical Microchannel Epitaxy," Journal of Crystal Growth. vol. 237-239, 2002, pp. 1460-1465.
Matthews et al., "Defects in Epitaxial Multilayers—Misfit Dislocations," Journal of Crystal Growth, vol. 27, 1974, pp.
Monroy et al., "High UV/visible Contrast Photodiodes Based on Epitaxial Lateral Overgrown GaN layers," Electronics Letters, vol. 35, No. 17, Aug. 19, 1999, pp. 1488-1489.
Nakano et al., "Epitaxial Lateral Overgrowth of AlN Layers on Patterned Sapphire Substrates," Source: Physica Status Solidi A, vol. 203, No. 7, May 2006, pp. 1632-1635.
Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.
Naoi et al., "Epitaxial Lateral Overgrowth of GaN on Selected-area Si (111) Substrate with Nitrided Si Mask," Journal of Crystal Growth, vol. 248, 2003, pp. 573-577.
Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Parillaud et al., "High Quality InP on Si by Conformal Growth," Applied Physics Letters, vol. 68, No. 19, May 6, 1996, pp. 2654-2656.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Vanamu et al., "Epitaxial Growth of High-Quality Ge Films on Nanostructured Silicon Substrates," Applied Physics Letters, vol. 88, 2006, pp. 204104.1-204-104.3
Vanamu et al., "Growth of High Quality Ge/$Si_{1-x}Ge_x$ on Nano-scale Patterned Si Structures," J. Vac. Sci. Technology. B, vol. 23, No. 4, Jul./Aug. 2005, pp. 1622-1629.
Yin et al., "Ultrathin Strained-SOI by Stress Balance on Compliant Substrates and FET Performance," 52 IEEE Trans. on Electron Devices 10, 2005, pp. 2207-2214.
Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation-density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Sangwoo, et al., "Multiple Layers of Silicon-on-Insulator Islands Fabrication by Selective Epitaxial Growth," Electron Device Letters, IEEE, vol. 20, No. 5, May 1999, pp. 194-196.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Yang et al., "High Performance CMOS Fabricated on Hybrid Substrate with Different Crystal Orientations," IEDM Tech. Dig., 2003, pp. 453-456.
Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.
Zang et al., "Nanoheteroepitaxial lateral overgrowth of GaN on nanoporous Si (111)," Applied Physics Letters, vol. 88, No. 14, Apr. 3, 2006, pp. 141925.
Yamamoto et al., "Optimization of InP/Si Heteroepitaxial Growth Conditions Using Organometallic Vapor Phase Epitaxy," Journal of Crystal Growth, vol. 96, 1989, pp. 369-377.
seebaugh et al., Promise of Tunnel Diode Integrated Circuits, Tunnel Diode and CMOS/HBT Integrated Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MSFET & Si CMOS Circuits," 9 Elec. Device Letters 9, Sep. 1988, pp. 444-446.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.

(56) References Cited

OTHER PUBLICATIONS

Su et al, "New Planar Self-Aligned Double-Gate Fully-depleted P-MOSFETs Using Epitaxial Lateral Overgrowth (ELO) and selectively grown source/drain (S/D)," 2000 IEEE Int'l. SOI Conf., pp. 110-111.
Sun et al., "Thermal Strain in Indium Phosphide on Silicon Obtained by Epitaxial Lateral Overgrowth," 94 Journal of Applied Physics 4, 2003, pp. 2746-2748.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "InGaAsP Multi-Quantum Wells at 1.5 /splmu/m Wavelength Grown on Indium Phosphide Templates on Silicon", Indium Phosphide and Related Materials, May 12-16, 2003, pp. 277-280.
Sun et al., "Sulfur doped Indium Phosphide on Silicon Substrate Grown by Epitaxial Lateral Overgrowth," Indium Phosphide and Related Materials 16$^{th}$ IPRM, May 31-Jun. 4, 2004, pp. 334-337.
Sun et al., "Selective Area Growth of InP on InP Precoated Silicon Substrate by Hydride Vapor Phase epitaxy," Indium Phosphide and Related Materials Conference, IPRM. 14$^{th}$, 2002, pp. 339-342.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Zubia et al., "Initial Nanoheteroepitaxial Growth of GaAs on Si (100) by OMVPE," Journal of Electronic Materials, vol. 30, No. 7, 2001, pp. 812-816.
Communication pursuant to Article 94(3) EPC, Application No. 06 770 525.1-2203, Applicant: Taiwan Semiconductor Company, Ltd., Feb. 17, 2011, 4 pages.
Park et al., "Defect Reduction of Selective Ge Epitaxy in Trenches on Si (001) Substrates Using Aspect Ratio Trapping," Applied Physics Letters 90, 052113, Feb. 2, 2007, 3 pages.
Zhang et al., "Strain Status of Self-Assembled InAs Quantum Dots," Applied Physics Letters, vol. 77, No. 9, Aug. 28, 2000, pp. 1295-1297.
Zheleva et al., "Lateral Epitaxy and Dislocation Density Reduction in Selectively Grown GaN Structures," Journal of Crystal Growth, vol. 222, No. 4, Feb. 4, 2001, pp. 706-718.
Yingda et al., "Selective area growth of InP through narrow openings by MOCVD and its application to inP HBT," Indium Phosphide and Related Materials, International Conference, May 12-16, 2003, pp. 389-392.
Yoon et al., "Selective Growth of Ge Islands on Nanometer-scale Patterned SiO$_2$/Si Substrate by Molecular Beam Epitaxy," Applied Physics Letters, vol. 89, 2006, pp. 063107.1-063107.3.
Takasuka et al., "AlGaAs/InGaAs DFB Laser by One-Time Selective MOCVD on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulatory (SC-SSOI) PMOS with Different Channel Orientations," IEEE, 2005, pp. 1-4.
Thompson et al., "A Logic Nanotechnology Featuring Strained-Silicon," 25 IEEE Electron Device Letters 4, 2004, pp. 191-193.
Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.
Tran et al., "Growth and Characterization of InP on Silicon by MOCVD," Journal of Crystal Growth, vol. 121, 1992, pp. 365-372.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.
Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Usuda et al., "Strain Relaxation of Strained-Si Layers on SiGe-on-Insulator (SGOI) Structures After Mesa Isolation," Applied Surface Science, vol. 224, 2004, pp. 113-116.
Usui et al., "Thick GaN Epitaxial Growth with Low Dislocation Density by Hydride Vapor Phase Epitaxy," vol. 36, Japan, Journal of Applied Physics, 1997, pp. L899-L902.
Zela et al., "Single-crystalline Ge Grown Epitaxially on Oxidized and Reduced Ge/Si (100) Islands," Journal of Crystal Growth, vol. 263, 2004, pp. 90-93.
Zhang et al., "Removal of Threading Dislocations from Patterned Heteroepitaxial Semiconductors by Glide to Sidewalls," Journal of Electronic Materials, vol. 27, No. 11, 1998, pp. 1248-1253.
Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.
Zang et al., "Nanoscale lateral epitaxial overgrowth of GaN on Si (111)," Applied Physics Letters, vol. 87, No. 19 (Nov. 7, 2005) pp. 193106.1-193106.3.
Notification of Transmittal of the International Search Report and the Written Opinion of the International Searching Authority for PCT/US2010/029552, Applicant: Taiwan Semiconductor Manufacturing Company, Ltd., May 26, 2010, 15 pages.
Tomiya, "Dependency of crystallographic tilt and defect distribution of mask material in epitaxial lateral overgrown GaN layers," Applied Physics Letters vol. 77, No. 5, pp. 636-638.
Noborisaka, J., et al., "Catalyst-free growth of GaAs nanowires by selective-area metalorganic vapor-phase epitaxy," Applied Physics Letters, vol. 86, May 16, 2005, pp. 213102-1-213102-3.
Noborisaka, J., et al., "Fabrication and characterization of freestanding GaAs/AlGaAs core-shell nanowires and AlGaAs nanotubes by suing selective-area metalorganic vapor phase epitaxy," Applied Physics Letters, vol. 87, Aug. 24, 2005, pp. 093109-1-093109-3.
European Search Report issued by the European Patent Office on Dec. 15, 2010 in European Patent Application No. 10002884.4 (10 pages).
Hydrick et al., "Chemical Mechanical Polishing of Epitaxial Germanium on SiO$_2$-patterned Si(001) Substrates," ECS Transactions, 16 (10), 2008, (pp. 237-248).
Li et al, "Monolithic Integration of GaAs/InGaAs Lasers on Virtual Ge Substrates via Aspect-Ratio Trapping," Journal of The Electrochemical Society, vol. 156, No. 7, 2009, pp. H574-H578.
Park et al., "Fabrication of Low-Defectivity, Compressively Strained Geon Si$_{0.2}$G$^e_{0.8}$ Structures Using Aspect Ratio Trapping," Journal of The Electrochemical Society, vol. 156, No. 4, 2009, pp. H249-H254.
European Patent Office, Extended European Search Report and Search Opinion dated Jan. 26, 2011 in EP Patent Application No. 10003084.0-2203 (9 pages).
Ashley, et al., "Heternogeneous InSb Quantum Well Transistors on Silicon for Ultra-High Speed, Low Power Logic Applications," 43 Electronics Letters 14, Jul. 2007, 2 pages.
Bai et al., "Study of the Defect Elimination Mechanisms in Aspect Ratio Trapping Ge Growth," Applied Physics Letters, vol. 90, 2007, 3 pages.
Datta et al., "Ultrahigh-Speed 0.5 V Supply Voltage In0.7Ga0.3As Quantum-Well Transistors on Silicon Substrate," 28 Electron Device Letters 8, 2008, pp. 685-687.

(56) References Cited

OTHER PUBLICATIONS

Li et al., "Defect Reduction of GaAs Epitaxy on Si (001) Using Selective Aspect Ratio Trapping," 91 Applied Physics Letters, 2007, pp. 021114-1-021114-3.

Park, et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.

Campo et al., "Comparison of Etching Processes of Silicon and Germanium in SF6-O2 Radio-Frequency Plasma," 13 Journal of Vac. Sci. Tech., B-2, 1995, pp. 235-241.

Oehrlein et al., "Studies of the Reactive Ion Etching of SiGe Allows," 9, Journal of Vac. Sci. Tech, A 3, 1991, pp. 768-774.

Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.

Williams et al., "Etch Rates for Micromachining Processing—Part 11," 12 J. Microelectromechanical Sys. 4, 1996, pp. 256-269.

Williams et al., "Etch Rates for Micromachining Processing," 5 J. Microelectromechanical Sys. 4, 1996, pp. 256-269.

Partial International Search Report for International Application No. PCT/US2008/004564, mailed Jul. 30, 2009, 9 pages.

\* cited by examiner

SEMICONDUCTOR DIODES FABRICATED BY ASPECT RATIO TRAPPING WITH COALESCED FILMS

This application is a divisional of U.S. patent application Ser. No. 12/684,499, filed Jan. 8, 2010, entitled "Semiconductor Diodes Fabricated by Aspect Ratio Trapping with Coalesced Films," which claims the benefit of U.S. Provisional Patent Application Ser. No. 61/143,602, filed on Jan. 9, 2009, entitled "Semiconductor Diodes Fabricated by Aspect Ratio Trapping with Coalesced Films," which applications are hereby incorporated herein by reference in their entireties.

CROSS-REFERENCE TO RELATED APPLICATIONS

This application relates to the following co-pending and commonly assigned patent application: TSM09-058US-AW, Ser. No. 12/684,797, filed on Jan. 8, 2010, entitled "Diode-Based Devices and Methods for Making the Same," which application is hereby incorporated herein by reference.

TECHNICAL FIELD

The present invention relates generally to semiconductor diodes made from compound semiconductors or other lattice-mismatched semiconductors on silicon wafers, as well as methods of fabricating such semiconductor diodes, and more particularly to photonic applications such as light emitting diodes (LEDs), lasers, photovoltaics, and other optoelectronic uses.

BACKGROUND

U.S. patent application Ser. No. 12/100,131 filed on Apr. 9, 2008 claims priority to U.S. Provisional Patent Application No. 60/922,533 filed on Apr. 9, 2007, which are hereby incorporated by reference in their entirety.

This section provides background information and introduces information related to various aspects of the disclosures that are described and/or claimed below. These background statements are not admissions of prior art.

The majority of chip manufacturing takes advantage of silicon processing on high-quality, large-area, low-cost silicon wafers. Commercial manufacturers of devices made from compound semiconductors such as gallium arsenide and indium phosphide generally have been unable to take advantage of silicon wafers. They typically build light emitting diodes (LEDs), multi-junction solar cells, and other compound semiconductor devices on small, expensive wafers made of materials such as sapphire, germanium, gallium arsenide, or silicon carbide.

The challenge of making compound semiconductor devices on inexpensive substrates has widespread economic implications. Compound semiconductors are an important component of our communications infrastructure because they can emit and detect light. They are the materials in the lasers that transmit signals through optical fibers, the sensors that receive those signals, the amplifiers in cellular telephones, the amplifiers in cell phone base stations, and the circuits that transmit and receive microwave signals.

Light-emitting diodes typically consist of gallium nitride films deposited onto sapphire or silicon carbide wafers. These exotic substrates contribute to the high cost of LEDs. A sapphire wafer 4 inches in diameter typically costs around $130, and a 2-inch silicon carbide wafer can cost about $2000. By contrast, an 8-inch silicon wafer, which provides four times as much surface area as a 4-inch wafer and 16 times as much surface area as a 2-inch wafer, typically costs less than $100.

High-efficiency multi-junction solar cells typically contain layers such as germanium, gallium arsenide, and indium gallium phosphide deposited onto germanium wafers. As is the case with wafers for LEDs, germanium wafers similarly are smaller and significantly more expensive than silicon wafers.

The ability to create compound semiconductor devices on silicon wafers would facilitate market growth in several key industries.

Two key technical barriers have inhibited the practical fabrication of compound semiconductor devices on silicon wafers: the mismatch of lattice constants and the mismatch of thermal expansion coefficients.

Lattice Mismatch: In a crystal, the atoms sit in a regular periodic array known as a lattice. The distance between the atoms, known as the "lattice constant," is typically a few ångstroms (1 ångstrom=$10^{-10}$ meter). Silicon has a smaller lattice constant than compound semiconductors. When compound semiconductors grow on silicon, crystalline imperfections known as misfit dislocations appear at the interface. The misfit dislocations create other crystalline defects known as threading dislocations, which propagate upward from the interface. Threading dislocations diminish the performance and the reliability of compound semiconductor devices such as lasers, solar cells, light-emitting diodes, etc.

Thermal Contraction Mismatch: Compound semiconductors typically grow at high temperatures, which can exceed 1000° C. When the wafer cools, the compound semiconductor film may contract more than the silicon wafer. As a result, the wafer may bow in a concave manner, stressing and ultimately cracking the film.

Until recently, the most promising previous efforts to grow high-quality compound semiconductors onto silicon substrates have relied on three approaches: graded buffer layers, wafer bonding, or selective growth on mesas. None of these approaches has achieved commercial success.

In graded buffer layers, the composition of the material changes gradually from substantially pure silicon to a compound semiconductor. Since the lattice constant also changes gradually, crystalline defects are less likely to form at the interface. Unfortunately, the graded buffer layers have to be relatively thick (about ten microns for a 4% lattice mismatch). The thick buffer layer increases both the costs and the likelihood of cracking.

Wafer bonding involves growing devices on expensive substrates, then lifting off the devices and bonding them to a silicon wafer. This approach rules out modern silicon processing as a route to cost reduction. Furthermore, bonding typically requires temperatures above 300° C. When the materials cool, the compound semiconductors may crack because they contract more than the silicon wafer.

Selective growth on a mesa exploits the mobility of some dislocations. The strategy is to deposit compound semiconductors in small regions (10 to 100 microns in length), thereby providing a short path where mobile dislocations can glide to the edge of the region and remove themselves from the device. However, structures created by this technique typically have a high density of threading dislocations (more than 100 million per square centimeter). This technique can't remove immobile dislocations, which predominate when the lattice mismatch exceeds 2%.

Aspect Ratio Trapping (J. S. Park et al., APL 90, 052113 (2007, hereby incorporated by reference) is a recently developed technology that makes it possible to deposit high-quality compound semiconductors, germanium or other lattice-mismatched materials on silicon wafers. FIG. 1 illustrates the principle of Aspect Ratio Trapping. We deposit a thin film of dielectric material (20) such as silicon dioxide (SiO2) or silicon nitride (SiNx) onto a silicon wafer (10). Those of ordinary skill in the art can select a variety of dielectric materials such as SiOxNy, and silicates or oxides of materials such as Hf or Zr.

We etch a trench in the dielectric material, then deposit a non-lattice-matched semiconductor (30) such as germanium or a compound semiconductor in the trench. The threading dislocations (40), shown as dotted lines, propagate upward, typically at approximately a 45 degree angle from the interface, then intersect the sidewalls of the trench, where they terminate. Threading dislocations (40) do not propagate down the length of the trench because they propagate in a direction perpendicular to the faceted growth face of the crystal—the facets guide the dislocations to the sidewalls, where the dislocations terminate. We refer to the region in the trench where the sidewalls trap threading dislocations as the "trapping region" (50). The upper region of the non-lattice-matched semiconductor (30), above the trapping region (50), is a relatively defect-free region (60).

ART addresses the issue of cracking caused from mismatch of thermal expansion coefficients for these reasons: (1) the stresses are small because the epitaxial layers are thin; (2) the material can elastically accommodate the stresses arising from thermal expansion mismatch because dimensions of the ART openings are small; and (3) the SiO2 pedestals, which are more compliant than the semiconductor materials, may deform to accommodate the stress.

Continuous high-quality films of high-quality III-V semiconductors or other non-lattice-matched materials may be provided on silicon wafers using Aspect Ratio Trapping as shown in FIG. 2. This technique is similar to the technique illustrated in FIG. 1, except that we continue to grow the non-lattice-matched semiconductor until the growth fronts from adjacent trenches coalesce to form a single continuous film (70). Additional defects, which we call "coalescence defects" (80), form at some of the "coalescence regions" where the growth fronts meet. However, the defect density is much lower than the defect density of a non-lattice-matched semiconductor grown directly on a silicon wafer.

SUMMARY OF THE INVENTION

In one aspect, the present disclosure is directed to a photonic device comprising a substrate, a dielectric material including two or more openings that expose a portion of the substrate, the two or more openings each having an aspect ratio of at least 1, a bottom diode material comprising a compound semiconductor material that is lattice mismatched to the substrate, and wherein the compound semiconductor material occupies the two or more openings and is coalesced above the two or more openings to form the bottom diode region, a top diode material, and an active diode region between the top and bottom diode materials.

In another embodiment, the present disclosure is directed to a photonic device comprising a substrate and a photonic diode comprising a first region proximate a top surface of the substrate, a second region proximate the first region, and an active region between the first and second regions, wherein the second diode region includes a surface adjacent the active photonic diode region, the surface being generally parallel to the substrate top surface, and the second diode region includes at least one defect-trapping region spaced apart from the active photonic diode region, the defect trapping region including a surface that extends away from the substrate top surface.

In another embodiment, the present disclosure is directed to a method of making a photonic device, the method comprising depositing a layer of a dielectric material onto a substrate, patterning two or more openings in the dielectric material to expose portions of the surface of the substrate, the two or more openings having an aspect ratio of at least 1, forming a bottom diode region by growing a compound semiconductor material that is lattice mismatched to the substrate in the two or more openings and allowing the compound semiconductor material to fill in the two or more openings and coalesce above the two or more openings to form a continuous layer, forming an active diode region on the bottom diode region, and forming a top diode region on the active diode region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Embodiments of the disclosure provide novel and useful architectures for semiconductor diodes made using coalesced films of compound semiconductors or other non-lattice-matched semiconductors deposited on silicon wafers by Aspect Ratio Trapping. The semiconductor diode is the fundamental building block of solar cells, light-emitting diodes, resonant tunneling diodes, semiconductor lasers, and other devices.

Aspects of the present disclosure include a reduction in the costs of solar cells, light-emitting diodes, and other compound semiconductor devices by creating them on high-quality, large-area, low-cost silicon wafers instead of smaller, more expensive substrates.

Other aspects of embodiments of the present disclosure provide for removal of the silicon wafer substrate from a semiconductor diode for devices in which the substrate can degrade performance, such as a light-emitting diode.

Still other aspects of embodiments of the present disclosure provide an economical way to fabricate a gallium nitride substrate; e.g., a high-quality film of gallium nitride on a thermally matched substrate such as polycrystalline aluminum nitride.

Other aspects of embodiments of the present disclosure provide less expensive donor wafers for creating gallium nitride films, which can then be transferred to other substrates such as aluminum nitride substrates.

Another aspect of the present disclosure is to mitigate thermally induced cracking in coalesced films grown by Aspect Ratio Trapping.

Yet other aspects of embodiments of the present disclosure provide more economical ways to create single chips containing a plurality of diode devices made from different semiconductor materials.

In the following description, exemplary diode structures are generally discussed in the context of a single diode; semiconductor engineers and others skilled in the art will understand that most applications require multiple diodes, typically integrated onto a single chip.

Figure 1:
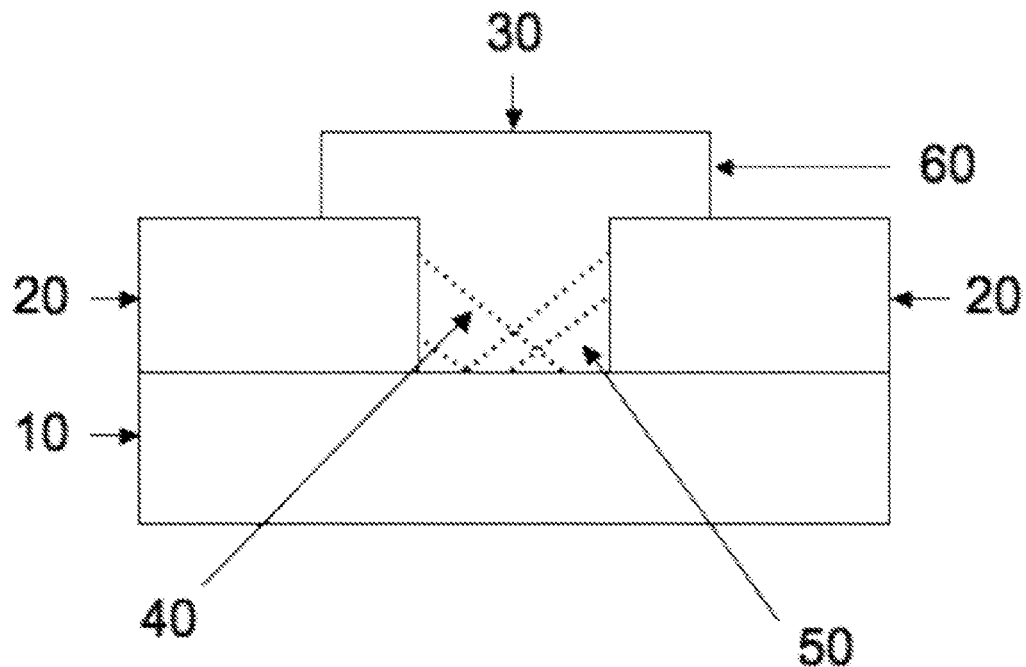
FIG. 1 illustrates the principle of Aspect Ratio Trapping, a method of depositing high-quality compound semiconductors or other non-lattice-matched semiconductors on silicon wafers.
Figure 2:
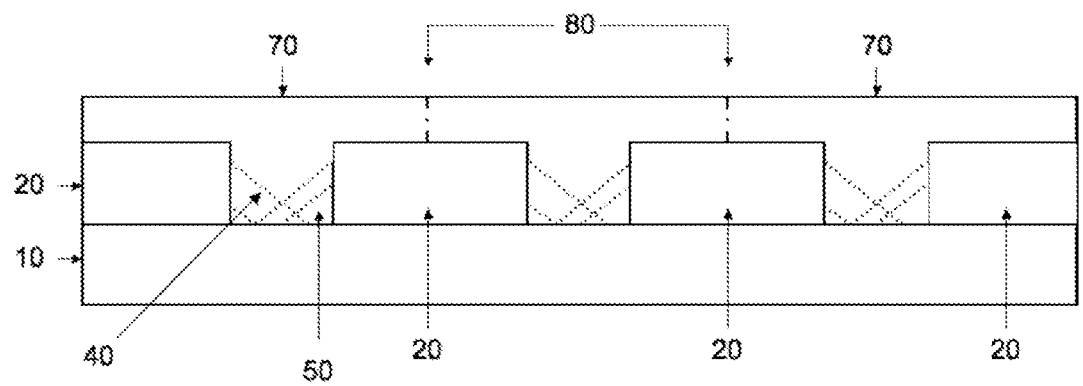
FIG. 2 illustrates the technique for growing continuous films of high-quality compound semiconductors or other non-lattice-matched semiconductors on silicon wafers by Aspect Ratio Trapping.
Figure 3:
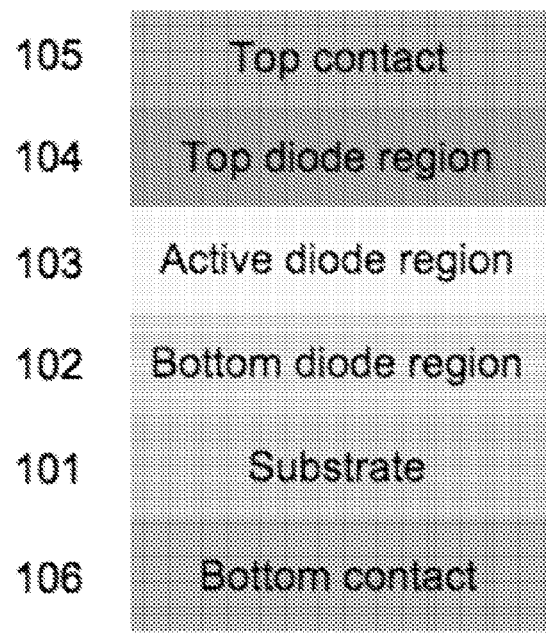
FIG. 3 shows the generic structure of semiconductor diodes.

In general, semiconductor diodes disclosed in this document have the generic structure illustrated in FIG. 3: a substrate (101), a bottom diode region (102), an active diode region (103), a top diode region (104), an electrical contact on the top of the device (105), and an electrical contact on the bottom of the device (106). Each of the diode regions (102, 103, 104) may be comprised of multiple layers.

The bottom diode region (102) and the top diode region (104) have opposite doping types. For example, if the bottom diode region (102) is predominantly n-type doped (with an electron donor such phosphorous, arsenic, or antimony), then the top diode region (104) will be predominantly p-type doped (with an electron acceptor such as boron or aluminum), and vice versa. Heavy doping in both the bottom diode region (102) and the top diode region (104) provides a low-resistance pathway for current to enter and leave the device. Typical doping levels of the top and bottom regions would be in the range of $10^{17}$-$10^{20}$ cm$^{-3}$. Typical doping levels of the active region would be below $10^{17}$ cm$^{-3}$. Note that the use of "top" and "bottom" for designating regions is a matter of convenience and in some frames of reference a top region can be located above a bottom region. For example, consider a diode formed above a substrate with its top region formed above its bottom region. If the diode is flip-chip bonded to a handle wafer and then the substrate is removed, the frame of reference for viewing the diode typically is flipped. In this case the top region will be viewed as being below the bottom region.

The substrate (101) is typically a silicon wafer, although in different embodiments a variety of other substrates including sapphire and silicon carbide, are suitable. At least some portion of the substrate (101) usually will have the same predominant doping type (either n or p) as the bottom diode region (102) to facilitate good electrical contact between the bottom diode region (102) and the substrate (101).

The detailed structure of the active diode region (103) may depend upon numerous factors, including the intended application. In one form, the active diode region (103) is formed by the junction of the top diode region (102) and the bottom diode region (104). In this case, it can be desirable to vary the doping of the top and bottom regions near the junction. In an LED, the active diode region (103) may contain many layers that include both doped layers and thin undoped quantum wells where electrons and holes can recombine and generate photons. In another example of a solar cell, the active diode region (103) may consist of a single layer of moderately n-doped or moderately p-doped semiconductor material to absorb incident photons and generate an electron-hole pair.

The materials used to form the diode regions are well known to those of skill in the art. Typical examples of useful semiconductor materials are: Group IV materials, such as Si, C, or Ge, or alloys of these such as SiC or SiGe; Group II-VI compounds (including binary, ternary, and quaternary forms), e.g., compounds formed from Group II materials such as Zn, Mg, Be or Cd and Group VI materials such as Te, Se or S, such as ZnSe, ZnSTe, or ZnMgSTe; and Group III-V compounds (including binary, ternary, and quaternary forms), e.g., compounds formed from Group III materials such as In, Al, or Ga and group V materials such as As, P, Sb or N, such as InP, GaAs, GaN, InAlAs, AlGaN, InAlGaAs, etc. Those of skill in the art understand how to select and process these materials based on desired properties such as bandgaps, lattice constants, doping levels, etc.

Figure 4:
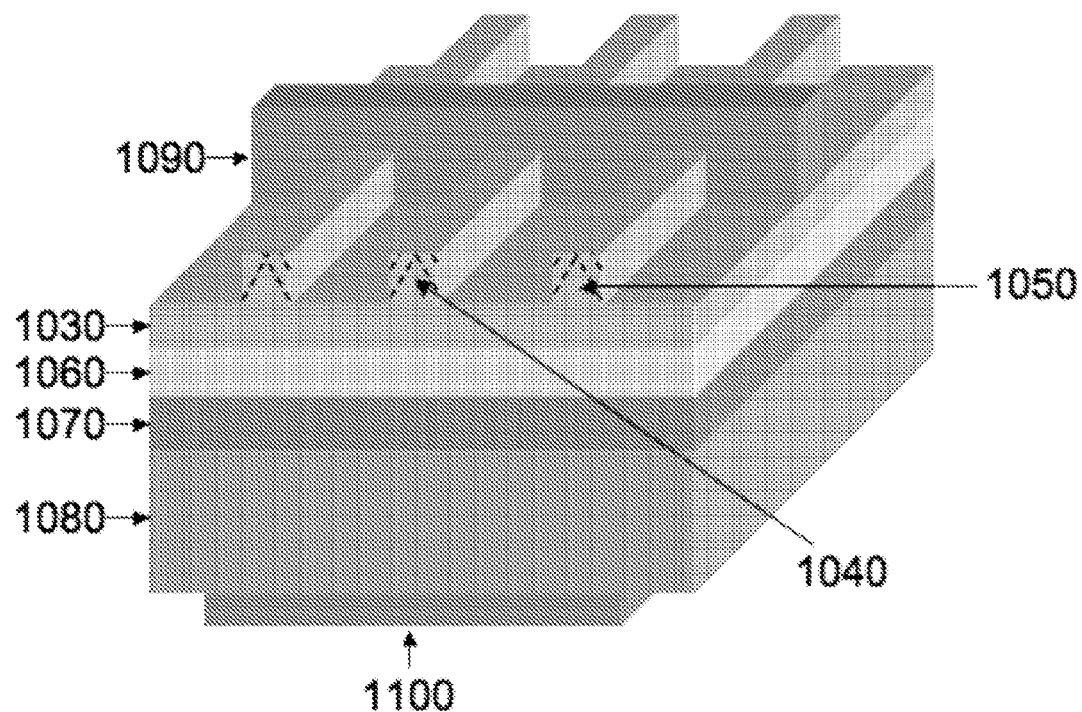
FIG. 4 shows a semiconductor diode according to a first embodiment.

FIG. 4 shows an illustrative semiconductor diode embodiment. This diode architecture is suitable for devices in which the substrate can degrade performance. In a light-emitting diode, for example, a silicon substrate can absorb light generated within the device. In the embodiment illustrated in FIG. 4, we have removed the silicon substrate.

Figure 5:
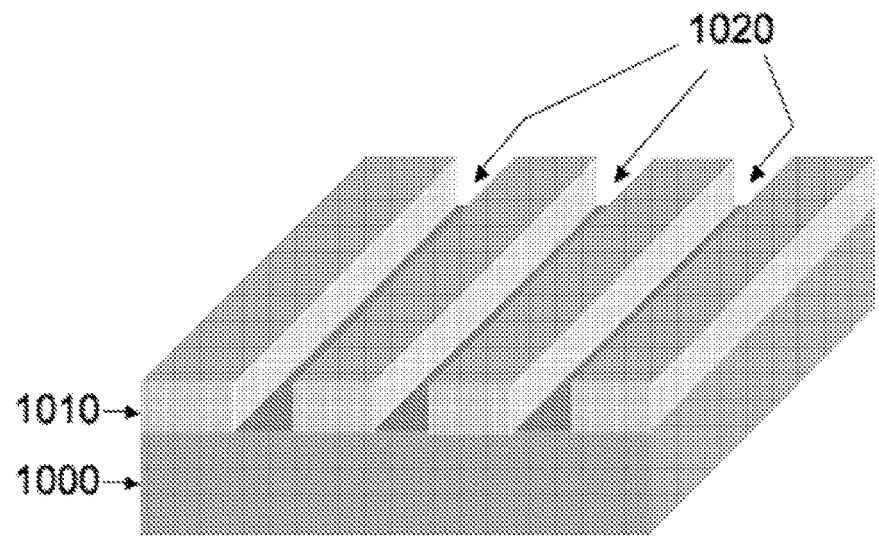
FIGS. 5 and 6 show exemplary successive stages of construction for the first embodiment semiconductor diode.

FIG. 5 shows the results of the preliminary stages of construction. The foundation is a substrate (1000) such as a silicon wafer in which the surface preferably has a (111) crystal orientation, although other orientations are possible and in some embodiments other orientations such as (100) can be selected. The substrate (1000) can be either n-doped or p-doped, depending on the configuration of the diode-based device. The first step is to deposit a layer of dielectric material (1010) such as SiO2 or SiNx onto the silicon wafer (1000) by chemical vapor deposition (CVD) or another deposition technique. In devices where reflection of light from the dielectric layer creates a problem, silicon nitride can be preferable because its index of refraction is closer to that of common semiconductor materials. The thickness of the dielectric film is typically 200 to 400 nm, but it can be thicker or thinner.

Then we pattern openings for aspect ratio trapping, such as trenches (1020) with substantially vertical sidewalls in the layer of dielectric material (1010), thereby exposing the surface of the silicon wafer (1000) within the trenches. Two exemplary ways to pattern a trench (1020) are by conventional photolithography or by reactive ion etch techniques. As would be recognized by one skilled in the art based on the disclosure herein, the trench could be another shaped opening such as a hole, recess or ring for example. The width of the trench (1020) should be equal to or less than the thickness of the dielectric material. This condition emerges from the principles of Aspect Ratio Trapping: the ratio of the height of the trench (1020) to the width of the trench (1020) should generally be greater than or equal to 1 in order to trap threading dislocations. Further details regarding this technique are disclosed in co-pending and commonly assigned U.S. patent application Ser. No. 11/436,198, and U.S. patent application Ser. No. 11/852,078, which are hereby incorporated in their entirety by reference). And in (Park et al., Appl. Phys. Lett. 90, 052113 [2007]), which is incorporated herein by reference.

In some cases, it may be advantageous to clean the surface of the silicon substrate (1000) at the bottom of the trenches (1020) to prepare for epitaxial growth of the bottom diode region. For one version of a suitable cleaning process, which includes an oxygen plasma etch, see Park et al., Appl. Phys. Lett. 90, 052113 [2007].

Figure 6:
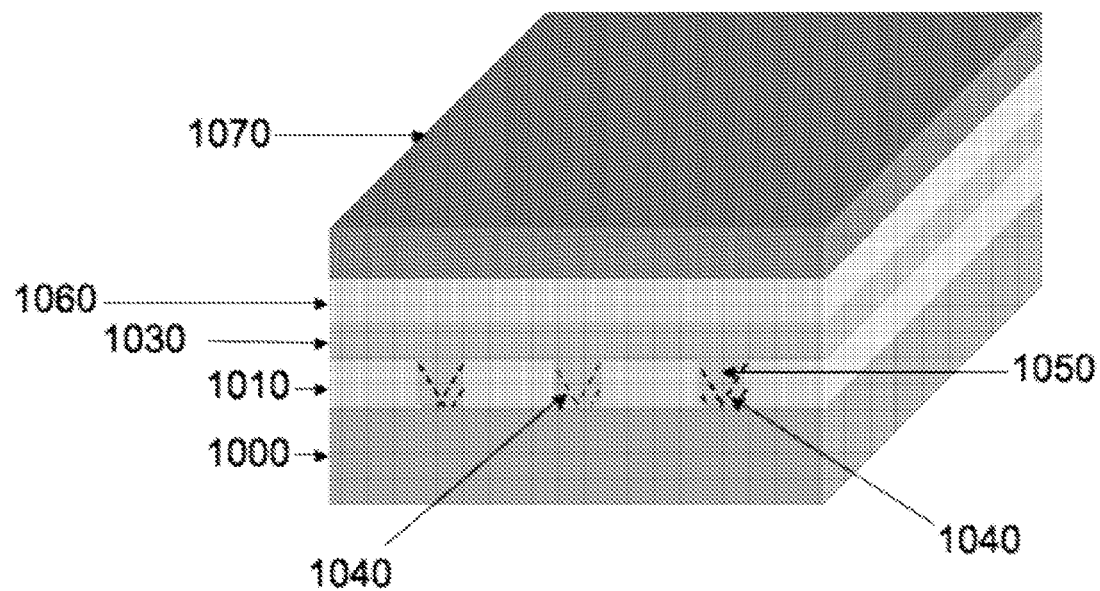

FIG. 6 illustrates the results of the next several steps. First we grow the bottom diode region (1030). The semiconductor material for the bottom diode region (1030) depends on the device. For a solar cell, the bottom diode region (1030) is, for example, indium gallium phosphide (InGaP). For a light-emitting diode, the bottom diode region (1030) is, for example, gallium nitride (GaN). We can also make the bottom diode region from many other semiconductor materials, including compound semiconductor materials, which have useful properties for devices such as lasers and resonant tunneling diodes. Exemplary semiconductor materials are described above.

It is possible to dope the bottom diode region (1030) in situ during epitaxial growth or to dope it ex situ by ion implantation. (As a general matter, it is generally preferable to dope the bottom diode regions, active diode regions, and top diode regions mentioned in this disclosure, and it is possible to dope them either in situ during epitaxial growth or ex situ by ion implantation.)

We refer to a portion of the bottom diode region (1030) in the trenches (1020) as the "trapping region" (1050) because it traps dislocations such as threading dislocations (1040), which originate at the interface between the bottom diode region (1030) and the substrate (1000) and propagate upward towards the side walls. FIG. 6 illustrates the threading dislocations (1040) as dashed lines. The portion of the bottom diode region (1030) which lies above the trapping region (1050) remains relatively free of defects. This low-defect region enables us to create high-quality compound semiconductor devices on high-quality, large-area, low-cost silicon wafers. For some materials, such as GaN, InN, AlN, or ternary or quarternary combinations of these, a dislocation density of e.g. less than or equal to $10^8/cm^2$ is low enough to be useful for device applications. For some other materials, such as GaAs and InP, a somewhat lower dislocation density is typically required to be useful for devices, e.g. less than or equal to $10^6/cm^2$.

We continue to grow the bottom diode region (1030) until a) the material overflows the trenches, and b) the material from adjacent trenches coalesce to form a single continuous film. It is typically desirable to planarize the bottom diode region (1030) by chemical mechanical processing or any other suitable technique before further fabrication. The next steps are to deposit the active diode region (1060) and the top diode region (1070). In most embodiments, the active diode region (1060) and the top diode region (1070) have the same or approximately the same lattice constants as the bottom diode region (1030).

FIG. 4 shows the results of the final steps. We bond a handle substrate (1080) to the top diode region (1070). In some embodiments, it may be preferable to planarize the top diode region (1070) in order to achieve a high-quality bond to the handle substrate (1080). In still other embodiments, it may be preferable to include an intermediate layer between the top diode region (1070) and the handle substrate (1080) to improve adhesion, minimize thermal mismatch, or the like. The handle substrate (1080) could be part of an LED packaging fixture. Bonding methods are well known, including those used in flip-chip bonding, where the top portion of an LED is bonded to a surface that is part of an LED package. The handle substrate (1080) may be conductive, or it may contain conductive elements which serve as contacts for the top diode region (1070). Then we remove the silicon substrate (1000) by standard techniques such as grinding, chemical etch-back, laser ablation, or some combination of those methods.

Finally, we add a first electrical contact (1090) to the bottom diode region (1030) and a second electrical contact (1100) to the handle substrate (1080). In various embodiments the material for the electrical contacts can be, for example, a strip of conductive metal such as copper, silver, or aluminum, or a layer of relatively transparent conductive oxide such as indium tin oxide. For light-emitting diodes, the bottom electrical contact (1100) should preferably be a highly reflective conductive material, such as silver, which will reflect the internally created light so it will exit the LED from another surface.

People skilled in the art of semiconductor diode manufacturing know many materials for and ways of adding electrical contacts. FIG. 4 shows one option for creating the first electrical contact (1090): we have removed the dielectric layer (1010) to expose the surface of the bottom diode region (1030). Here, the dielectric material (1010) is removed by standard techniques such as etching. In an LED, the trapping regions (1050) shown in FIG. 4 could effectively roughen the surface to reduce internal reflection of light, provided that their size and spacing were correct.

The following are examples of process parameters sufficient to form the bottom, active, and top diode regions according to embodiments in this disclosure. First, a substrate and a patterned dielectric layer as known in the art are provided. Exemplary process parameters for bottom, active, and top diode regions, for of a GaAs and AlGaAs-based LED, according to one embodiment are below.

A) Bottom diode region (e.g., 1030): (e.g., 100 nm-500 nm thick layer of GaAs);
Pressure: 0.1 atm
Precursors: TMG (Trimethylgallium) and 20% AsH3 (Arsine), diluted in H2
Temperature: 720C
N-type: dope with silicon
B) Active diode region (e.g., 1060): AlGaAs layer for carrier confinement (15 nm thick)
Pressure: 0.1 atm
Precursors: TMG, TMA (Trimethylaluminium), and 20% arsine, diluted in H2
Temperature: 850C
N-type: dope with silicon
GaAs Quantum well for emission (10 nm thick)
Pressure: 0.1 atm
Precursors: TMG and 20% arsine , diluted in H2

Temperature: 720C
No doping
AlGaAs layer for carrier confinement (15 nm thick)
Pressure: 0.1 atm
Precursors: TMG, TMA (Trimethylaluminium), and 20% arsine, diluted in H2
Temperature: 850C
P-type: dope with zinc
C) Top diode region (e.g., 1070): (e.g., 100 nm-500 nm thick layer of GaAs)
Pressure: 0.1 atm
Precursors: TMG and 20% arsine, diluted in H2
Temperature: 720C
P-type: dope with zinc Exemplary prophetic process parameters of growth conditions (e.g., CVD) for bottom, active, and top diode regions, for a GaN and InGaN-based LED, according to the first embodiment 1 are below.

A) Bottom diode region (e.g., 1030):
GaN low-temperature buffer (e.g., 30 nm thick)
Pressure: 100 Torr
Precursors: TMG and NH3, diluted in H2
Temperature: 530C
N-type: dope with silicon
GaN hi-temperature buffer (e.g., 500 nm thick)
Pressure: 100 Torr
Precursors: TMG and NH3, diluted in H2
Temperature: 1030C
N-type: dope with silicon
B) Active diode region (e.g., 1060):
InGaN Quantum well layer for emission (e.g., 2 nm thick)
Pressure: 100 Torr
Precursors: TMG+TMI+NH3, diluted in N2
Temperature: 740C
No doping
GaN barrier layer for carrier confinement (e.g., 15 nm thick)
Pressure: 100 Torr
Precursors: TMG and NH3, diluted in H2
Temperature: 860C
N-type: dope with silicon
C) Top diode region (e.g., 1070): GaN p-contact layer (e.g., 100 nm thick)
Pressure: 100 Torr
Precursors: TMG and NH3, diluted in H2
Temperature: 950C
P-type: dope with magnesium Embodiment No. 1, shown in FIG. 4, includes a semiconductor diode made from compound semiconductors or other lattice-mismatched materials on a silicon wafer comprising these elements: a bottom diode region (1030), an active diode region (1060), a top diode region (1070), a handle substrate (1080), a first electrical contact (1090), a second electrical contact (1100), and a trapping region (1050) where threading dislocations terminate.

The bottom diode region (1030), the active diode region (1060), and the top diode region (1070) will have low defect densities (typically less than or equal to $5 \times 10^7$ per square centimeter) as a result of growing the bottom diode region (1030) as a coalesced film by Aspect Ratio Trapping.

Figure 7:
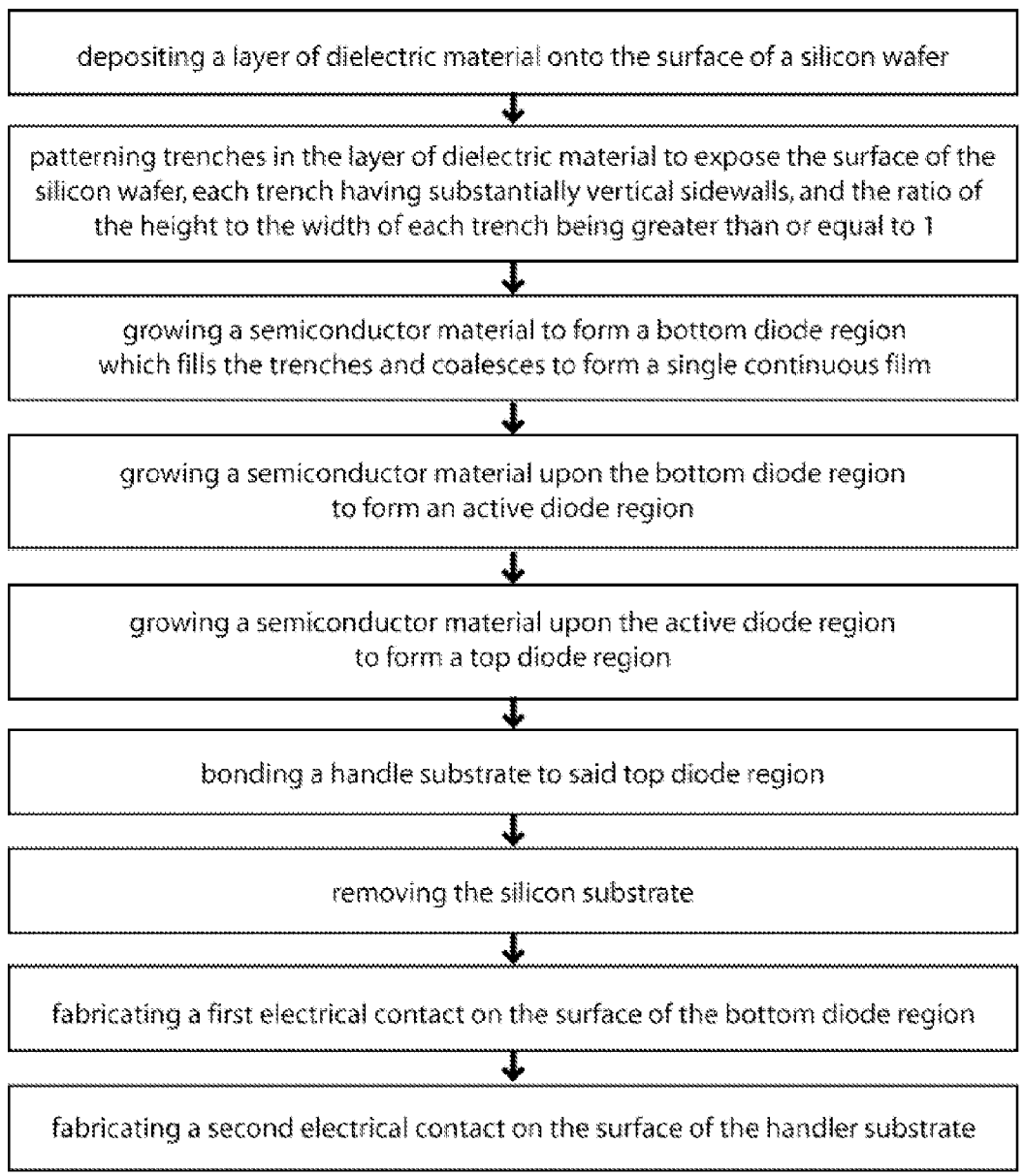
FIG. 7 is a flowchart illustrating a method of fabrication according to the first embodiment.

Turning now to FIG. 7, which illustrates a method of fabricating a device according to the first embodiment. The method includes: depositing a layer of dielectric material (1010) onto the surface of a silicon wafer (1000), patterning trenches (1020) in the layer of dielectric material (1010) to expose the surface of the silicon wafer (1000), each trench (1020) having substantially vertical sidewalls, and the ratio of the height to the width of each trench (1020) being greater than or equal to 1, growing a semiconductor material to form a bottom diode region (1030) which fills the trenches (1020) and coalesces to form a single continuous film, growing a semiconductor material upon the bottom diode region (1030) to form an active diode region (1060), growing a semiconductor material upon the active diode region (1060) to form a top diode region (1070), bonding a handle substrate (1080) to the top diode region (1070), removing the silicon substrate (1000), removing the dielectric material (1010), fabricating a first electrical contact (1090) on the surface of the bottom diode region (1030), and fabricating a second electrical contact (1100) on the surface of the handle substrate (1080).

Figure 8:
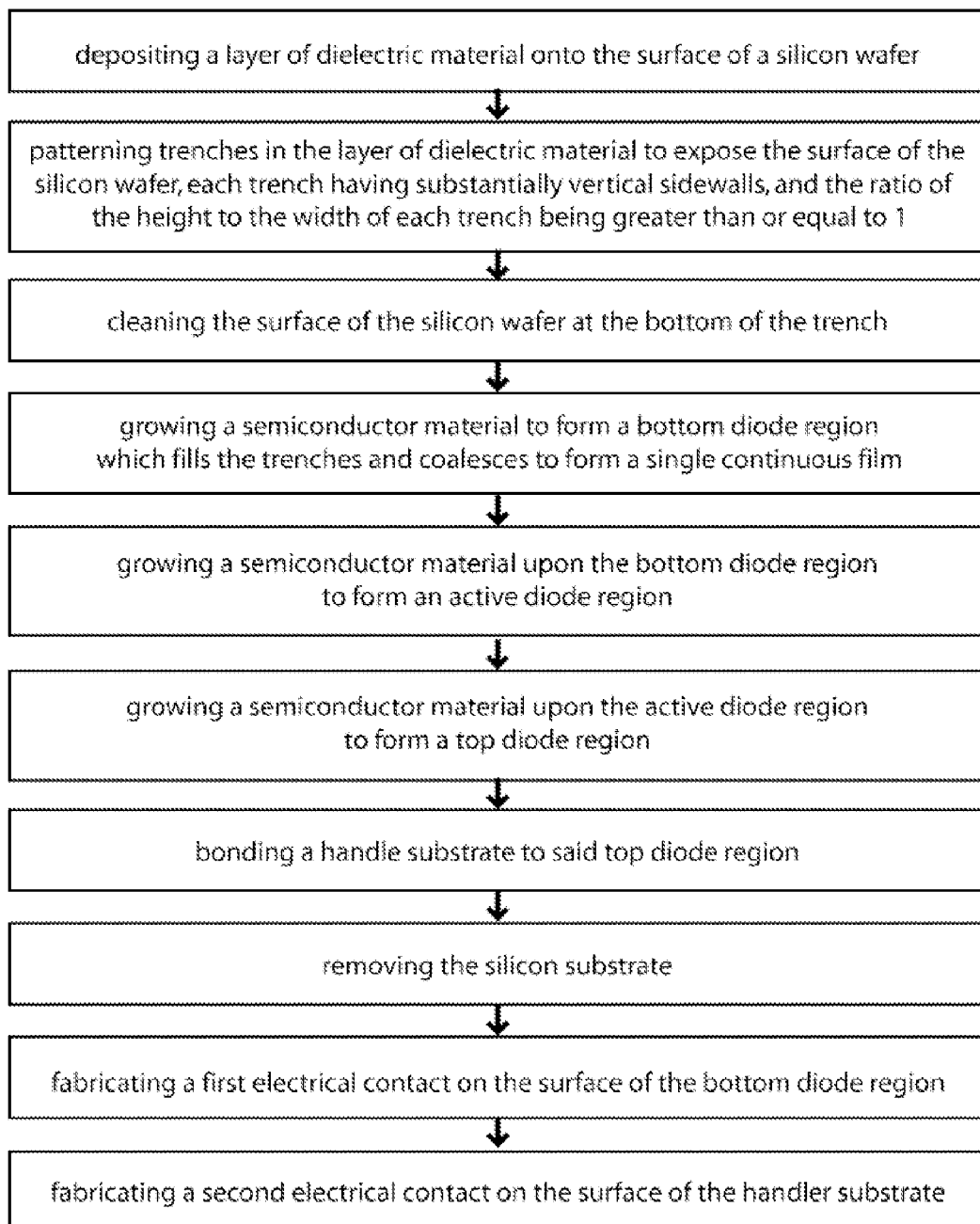
FIGS. 8, 9, and 10 illustrate variations on the method illustrated in FIG. 7.
Figure 9:
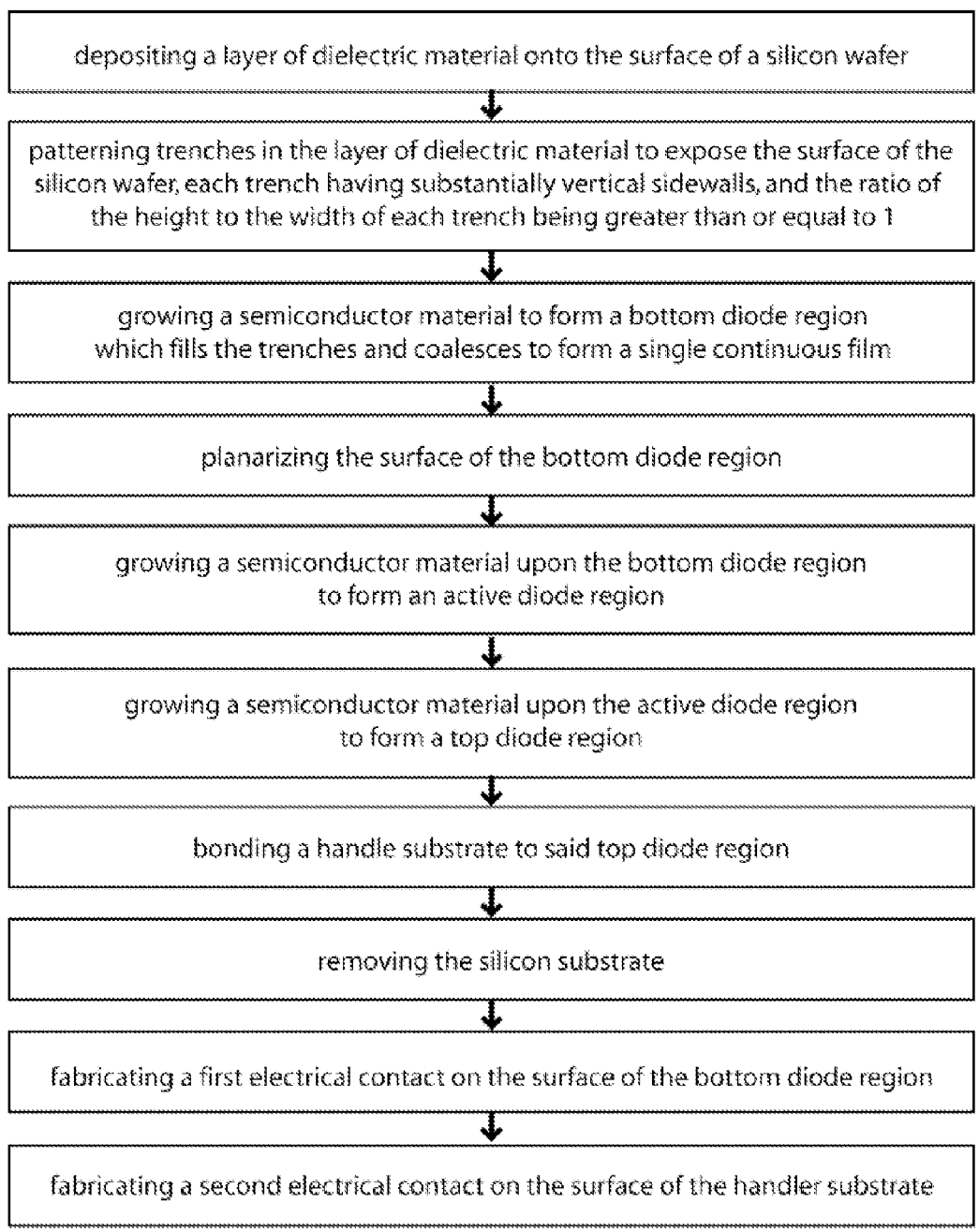
Figure 10:
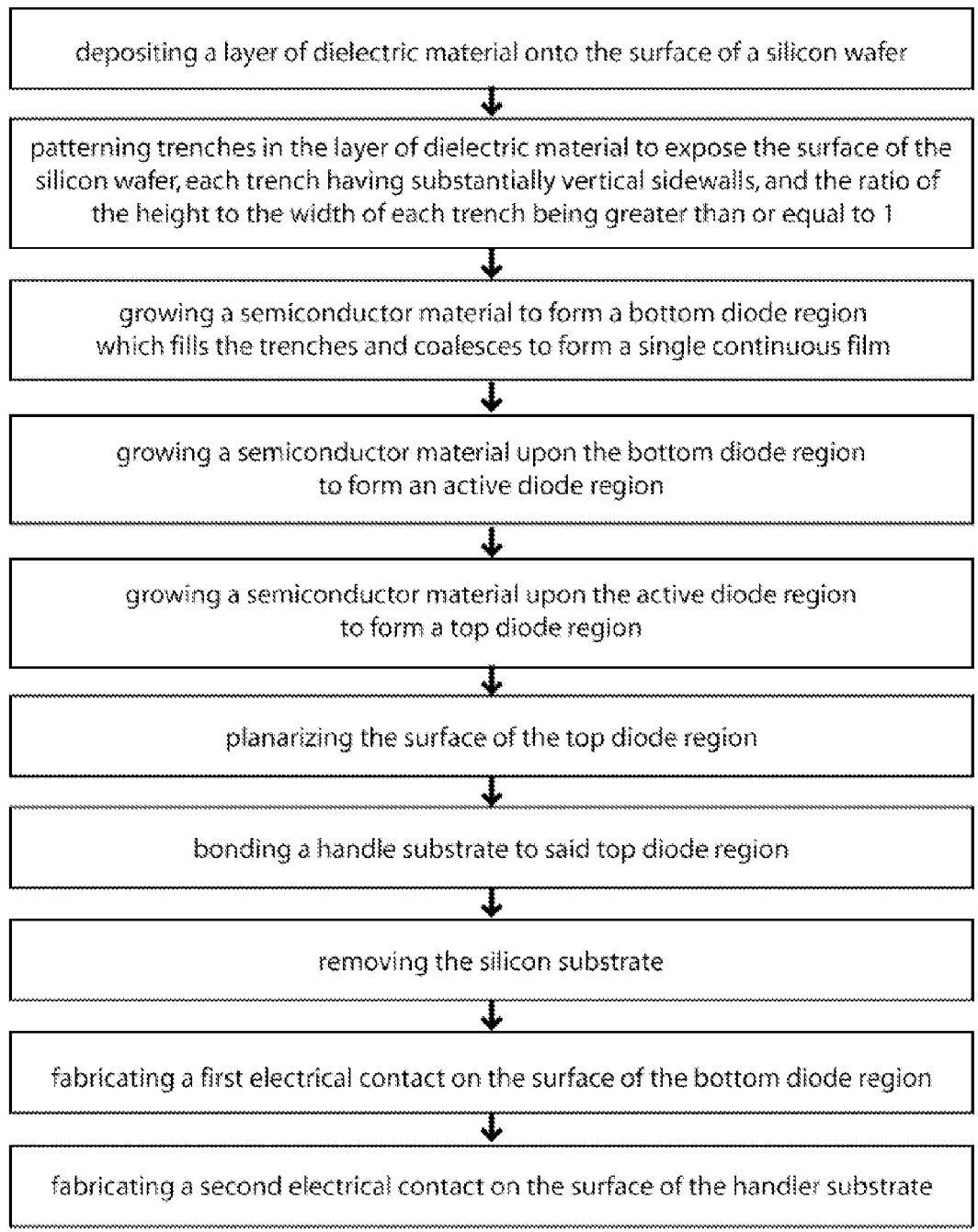

FIG. 8 summarizes a variation of the method illustrated in FIG. 7 in which we clean the surface of the silicon wafer at the bottom of the trenches before depositing the bottom diode region. FIG. 9 summarizes another variation in which we planarize the surface of the bottom diode region before growing the active diode region. FIG. 10 summarizes yet another variation in which we planarize the surface of the top diode region before bonding it to the handle substrate.

Another exemplary embodiment allows coalesced films deposited by Aspect Ratio Trapping to create gallium nitride substrates. In this document, as in the LED industry, the term "gallium nitride substrate" means a thin film as well known in the art of gallium nitride (GaN) grown onto, or bonded onto, a substrate made from a material other than GaN. LED manufacturers typically buy GaN substrates from materials suppliers, then deposit additional layers of GaN and other materials to create LEDs. A typical GaN substrate consists of a layer of GaN deposited on a wafer of sapphire (Al2O3) silicon carbide. The worldwide market for gallium nitride substrates currently is about $300 million per year.

Materials suppliers typically deposit GaN onto Al2O3 because these two materials have a reasonably good lattice match. However, GaN and Al2O3 have very different thermal expansion coefficients. When LED manufacturers heat the GaN/Al2O3 structure to deposit additional layers, the difference in thermal expansion coefficients causes the structure to bow. The bowing causes some portion of the Al2O3 wafer to lose contact with the susceptor, the substrate heater in the deposition chamber. As a result, the temperature of the Al2O3 wafer varies as a function of position. The inconsistent Al2O3 wafer temperature causes variations in layer composition and layer thickness. The practical consequence is that manufacturers have difficulty controlling the emission wavelength of the resulting LED.

An emerging technique for creating GaN substrates may solve or at least ameliorate this problem. The essence of this emerging technique is to extract a GaN thin film from a donor wafer and to bond that film to a substrate of aluminum nitride, which has a thermal expansion coefficient similar to that of GaN. The donor wafer is typically a wafer of single-crystal GaN. The conventional method of extracting the GaN thin film from the donor wafer involves ion implantation and exfoliation. The manufacturers implant hydrogen ions into the donor wafer to create a cleave plane, then split the donor wafer by annealing it or by applying mechanical pressure. This technique makes it possible to extract multiple thin films from a single donor wafer.

Figure 11:
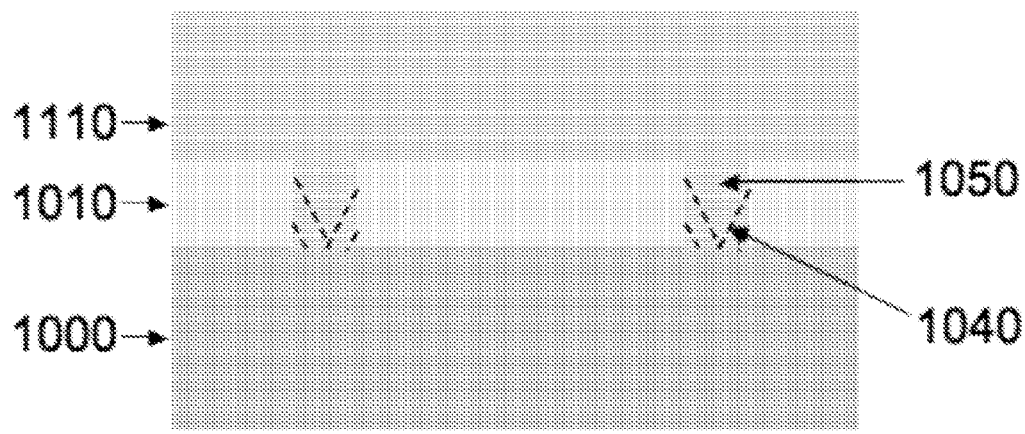
FIG. 11 shows a donor wafer according to a second embodiment.

FIG. 11 illustrates a second embodiment that provides for a novel donor wafer which can be produced at lower cost than a donor wafer of single-crystal GaN. We begin with a substrate (1000) such as a silicon wafer in which the surface has a (111) crystal orientation. However, other orientations are possible and in some embodiments other orientations such as (100) can be selected. The substrate (1000) can be either n-doped or p-doped. Onto that substrate (1000), we deposit a layer of dielectric material (1010). Next, we pattern trenches with substantially vertical sidewalls in the layer of dielectric material (1010), thereby exposing the surface of the silicon wafer (1000). In the stage of manufacture illustrated in FIG. 11, the trenches have been filled with semiconductor material (1100) as described below. As before, to promote trapping of threading dislocations, the width of each trench should be less than or equal to the thickness of the dielectric material. Optionally, we might then clean the surface of the silicon substrate (1000) at the bottom of the trenches by the techniques described above.

The next step is to grow a layer of semiconductor material (such as GaN) (1110) until the material overflows the trenches and the material from adjacent trenches coalesce to form a single continuous film. Exemplary semiconductor materials are described above. The portion of the semiconductor material (1110) which fills the trenches serves as a trapping region (1050); it traps the threading dislocations (1040). The portion of the semiconductor material (1110) above the trapping regions (1050) grows substantially free of threading dislocations. Coalescence defects may appear at some of the locations where the growth fronts from adjacent trenches merge, but the density of coalescence defects is low enough (generally less than or equal to $5\times10^7/cm^2$) to allow the structure to be technologically useful.

FIG. 11 illustrates a novel donor wafer which can yield multiple thin films from the layer of semiconductor material (1110). For example, the illustrated embodiment could provide a source of multiple GaN films which could be separated by ion implantation and exfoliation, then bonded to aluminum nitride wafers. Aspect Ratio Trapping makes it possible to create high-quality GaN films for this donor wafer on an inexpensive silicon substrate.

The embodiment shown in FIG. 11, is a donor wafer composed of these elements: a silicon wafer substrate (1000), a layer of dielectric material (1010) covering the silicon wafer substrate (1000), the layer of dielectric material (1010) containing trenches which expose the surface of the silicon wafer substrate (1000), the trenches having substantially vertical sidewalls, and the ratio of the height to the width of the trenches being greater than or equal to 1, a layer of semiconductor material (1110) which fills the trenches and overflows the trenches to create a single continuous film, and trapping regions (1050) within the trenches wherein threading dislocations (1040) intersect the sidewalls of the dielectric material and terminate.

Figure 12:
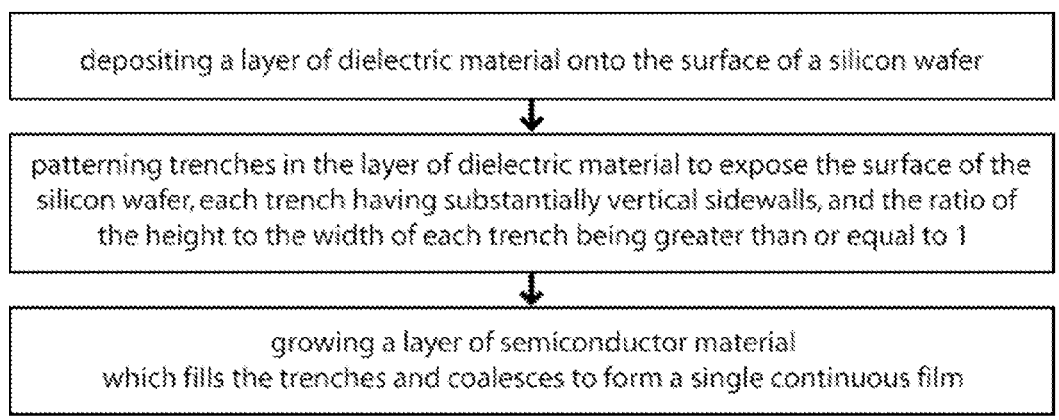
FIG. 12 is a flow chart illustrating a method of creating a second embodiment donor wafer.

FIG. 12 summarizes a method to fabricate the donor wafer shown in FIG. 11. It includes these steps: depositing a layer of dielectric material (1010) onto the surface of a silicon wafer (1000), patterning trenches in the layer of dielectric material (1010) to expose the surface of the silicon wafer (1000), each trench having substantially vertical sidewalls, and the ratio of the height to the width of each trench being greater than or equal to 1, and growing a layer of semiconductor material (1110) such as GaN which fills the trenches and coalesces to form a single continuous film.

Figure 13:
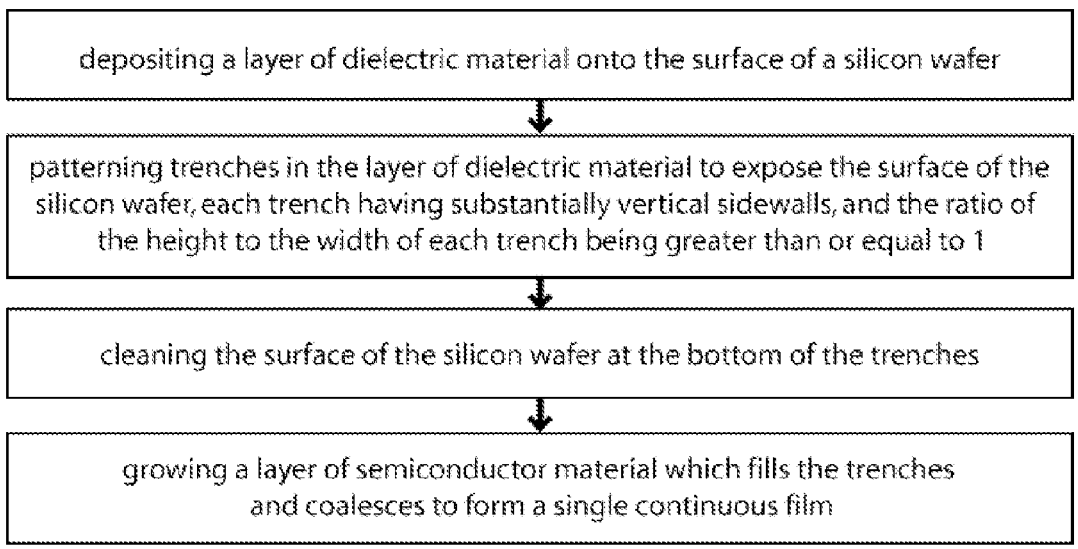
FIGS. 13 and 14 show variations on the method illustrated in FIG. 12.
Figure 14:
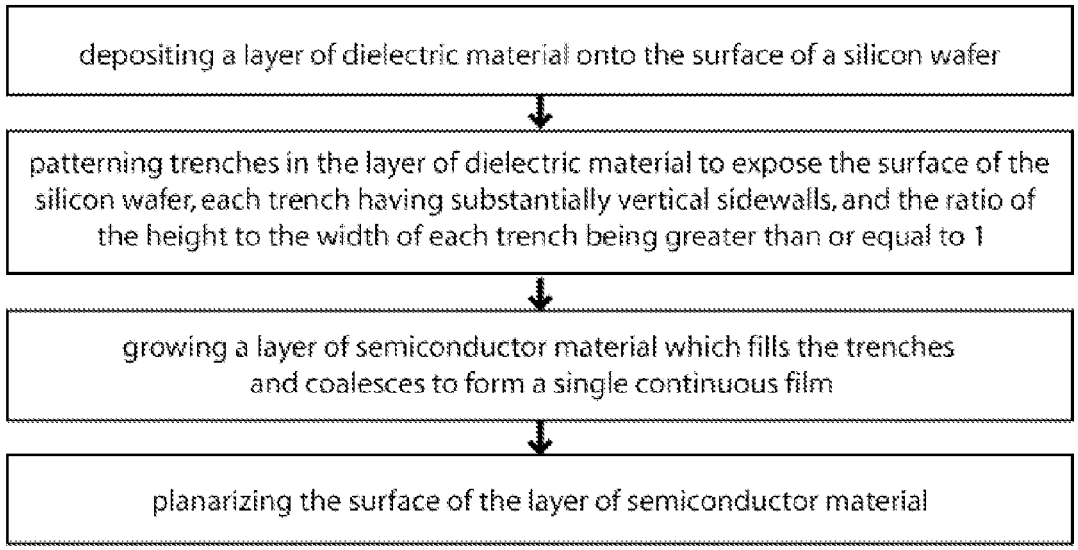

FIG. 13 summarizes a variation on the method illustrated in FIG. 12, in which we clean the surface of the silicon wafer substrate (1000) at the bottom of the trenches before growing the semiconductor material (1110). FIG. 14 summarizes another variation in which we planarize the surface of the semiconductor material (1110).

Described next is a way of exploiting the donor wafer concept described above to create a GaN substrate, such as a high-quality GaN film bonded to an AlN wafer. More generally, it is a method of creating a layer of semiconductor material bonded to an arbitrary substrate material.

Figure 15:
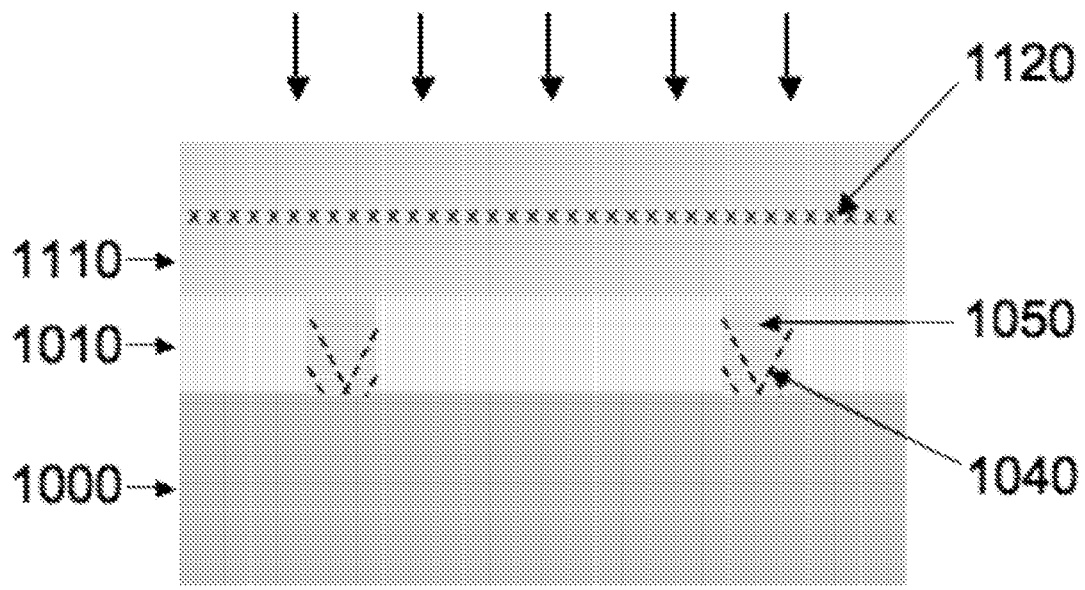
FIGS. 15 through 17 illustrate various steps in the method of exploiting a donor wafer to create a gallium nitride substrate.
Figure 16:
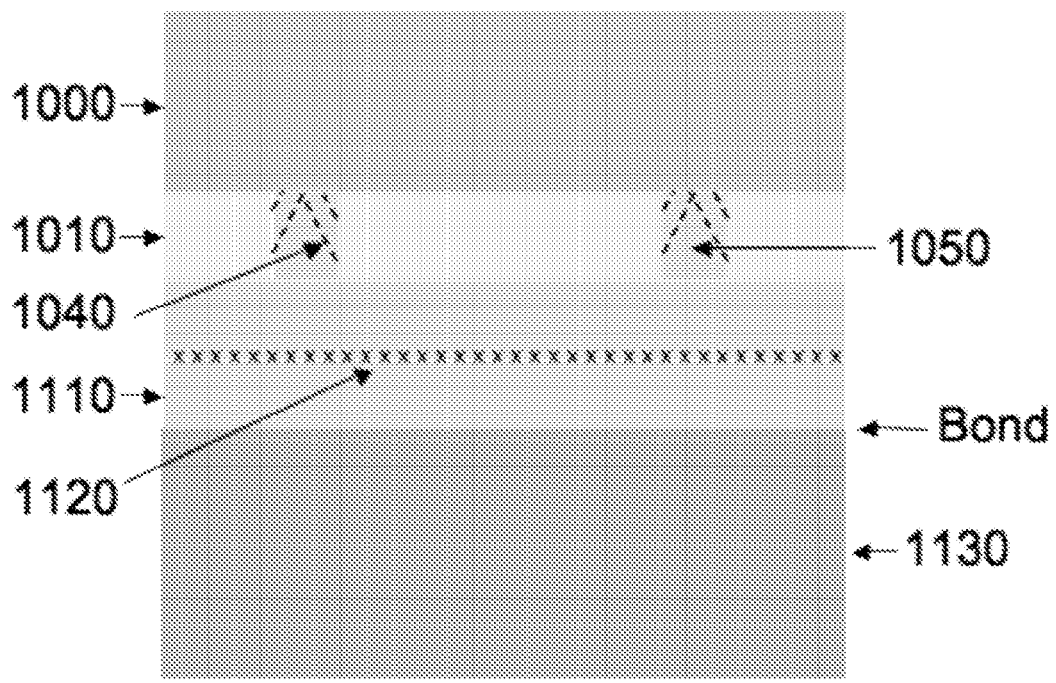

After we create the donor wafer (shown in FIG. 11), FIG. 15 illustrates a next step: we implant the layer of semiconductor material (1110) with ions, such as, for example, hydrogen ions or a combination of hydrogen and helium ions, to create a cleave plane (1120). Next we bond the layer of semiconductor material (1110) by conventional techniques to a handle substrate (1130), as shown in FIG. 16. If the semiconductor material (1110) is GaN, a generally preferred material for the handle substrate (1130) is a material with a similar thermal expansion coefficient, such as AlN.

Figure 17:
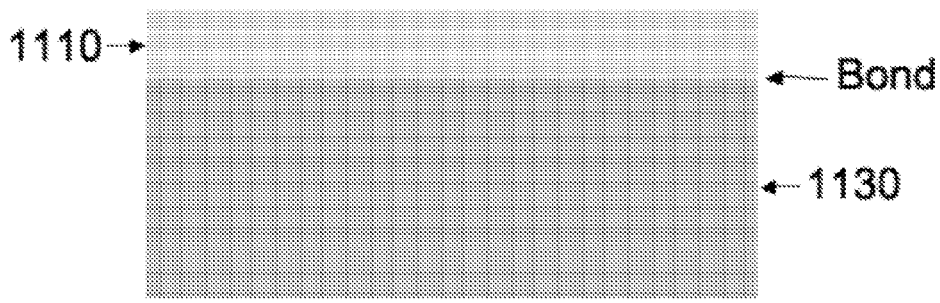

The final step is to split the layer of semiconductor material (1110) at the cleave plane (1120) by annealing it or by applying mechanical pressure. The result is shown in FIG. 17: a layer of semiconductor material (1110) bonded to a handle substrate (1130). This structure is especially useful when the defect density of the semiconductor material (1110) is low (e.g., less than or equal to $5\times10^7/cm^2$), when there is a mismatch of lattice constants between the semiconductor material (1110) and the handle substrate (1130), and/or there is a close match of thermal expansion coefficients between the semiconductor material (1110) and the handle substrate (1130). Again, for some materials, such as GaN, InN, AlN, or ternary or quarternary combinations of these, a dislocation density of e.g. less than or equal to $10^8/cm^2$ is low enough to be useful for device applications. For some other materials, such as GaAs and InP, a somewhat lower dislocation density is typically required to be useful for devices, e.g. less than or equal to $10^6/cm^2$.

Figure 18:
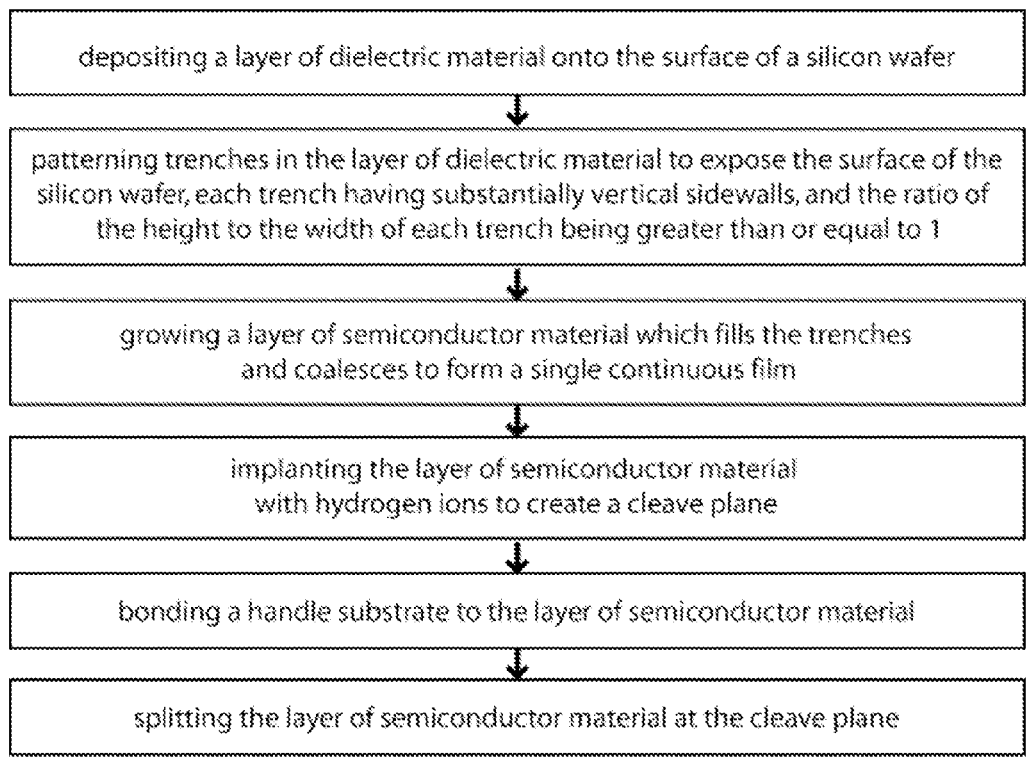
FIG. 18 is a flow chart illustrating the method illustrated in FIGS. 15 through 17.

FIG. 18 summarizes the above described method to create a structure composed of a layer of semiconductor material bonded to a substrate comprising these steps: depositing a layer of dielectric material (1010) onto the surface of a silicon wafer (1000), patterning trenches in the layer of dielectric material (1010) to expose the surface of the silicon wafer (1000), each trench having substantially vertical sidewalls, and the ratio of the height to the width of each trench being greater than or equal to 1, growing a layer of semiconductor material (1110) which fills the trenches and coalesces to form a single continuous film, implanting the layer of semiconductor material (1110) with ions to create a cleave plane (1120), bonding a handle substrate (1130) to the layer of semiconductor material (1110), and splitting the layer of semiconductor of material (1110) at the cleave plane (1120).

Figure 19:
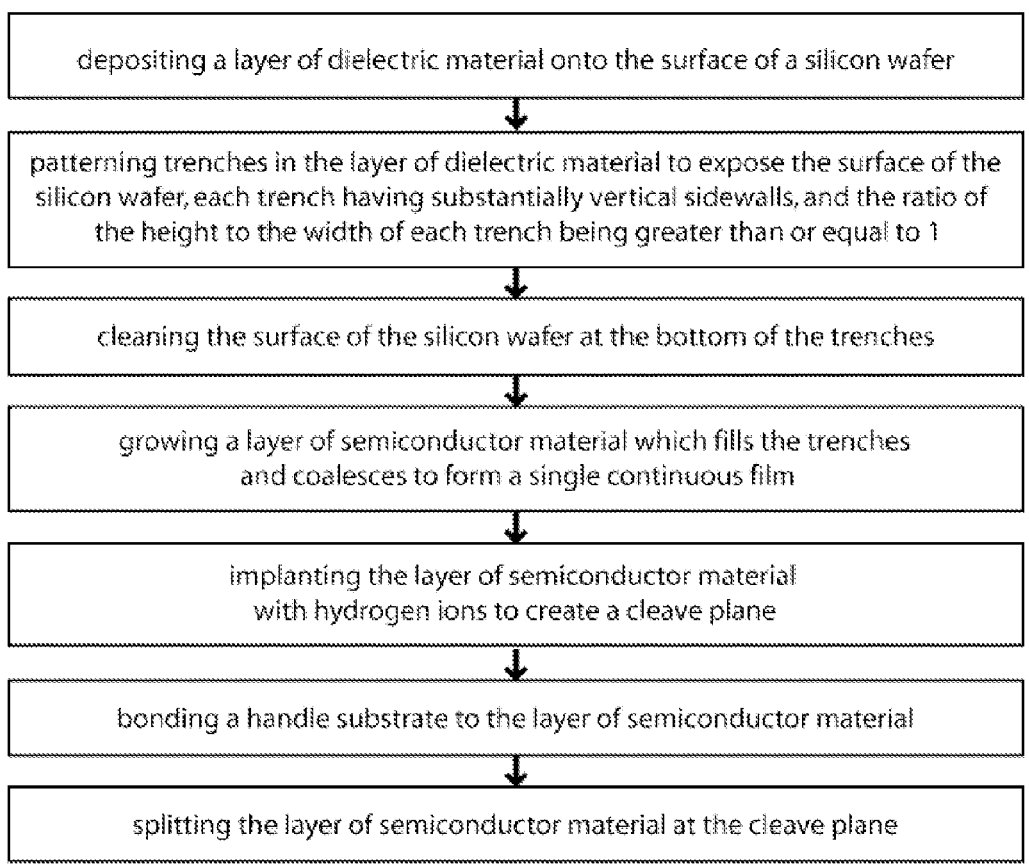
FIGS. 19 and 20 show variations on method illustrated in FIG. 18.
Figure 20:
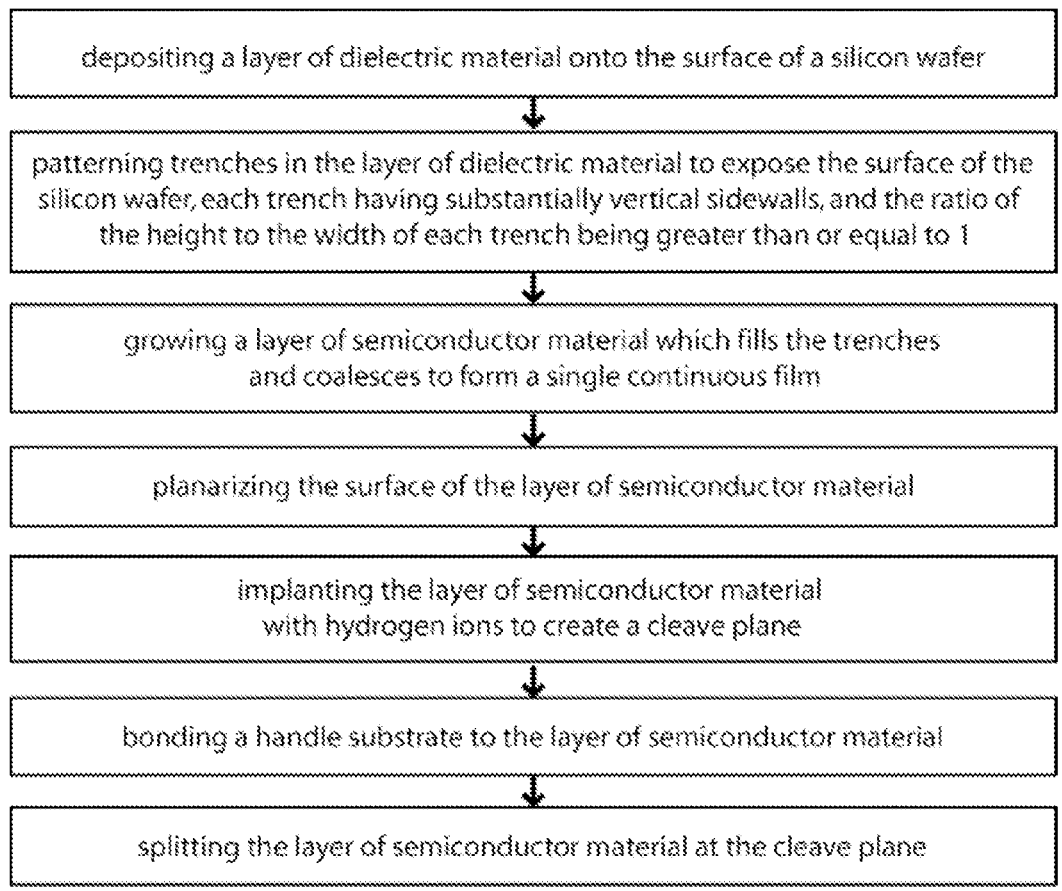

FIG. 19 summarizes a variation of the method illustrated in FIG. 19, in which we clean the surface of the silicon wafer (1000) at the bottom of the trenches before depositing the layer of semiconductor material (1010). FIG. 20 summarizes another variation of Method C in which we planarize the surface of the layer of semiconductor material (1110) before implanting it with ions.

Figure 21:
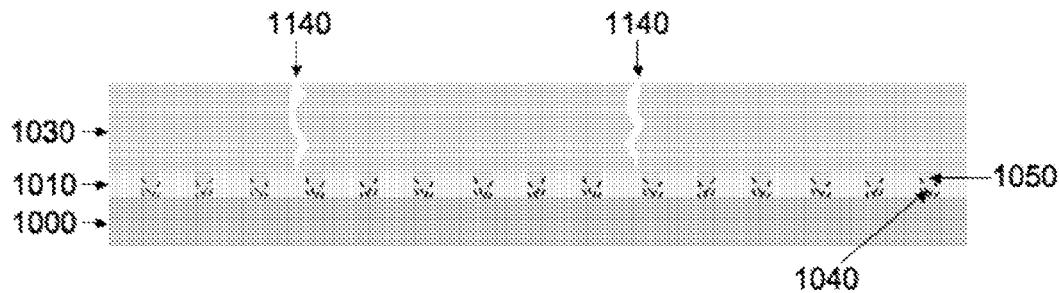
FIG. 21 shows how cracks can appear in an epitaxially grown film.

In some embodiments, coalesced films grown by Aspect Ratio Trapping may be susceptible to cracking because the epitaxial materials typically have larger thermal expansion coefficients than the silicon wafer substrate. When the structure cools from the growth temperature, the film contracts more than the substrate. As FIG. 21 illustrates, tensile strain in the film can lead to cracks (1140). Cracks (1140) can impair the performance and the reliability of devices such as LEDs or solar cells.

Figure 22:
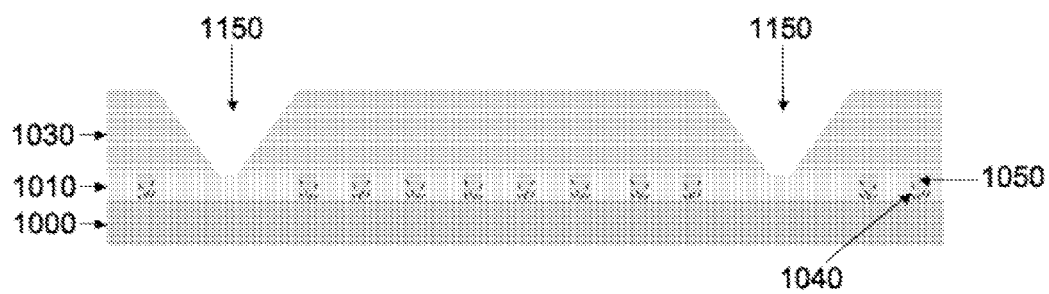
FIG. 22 illustrates a method of reducing the thermally induced stresses in a coalesced film of semiconductor material grown on a silicon substrate by Aspect Ratio Trapping.
Figure 23:
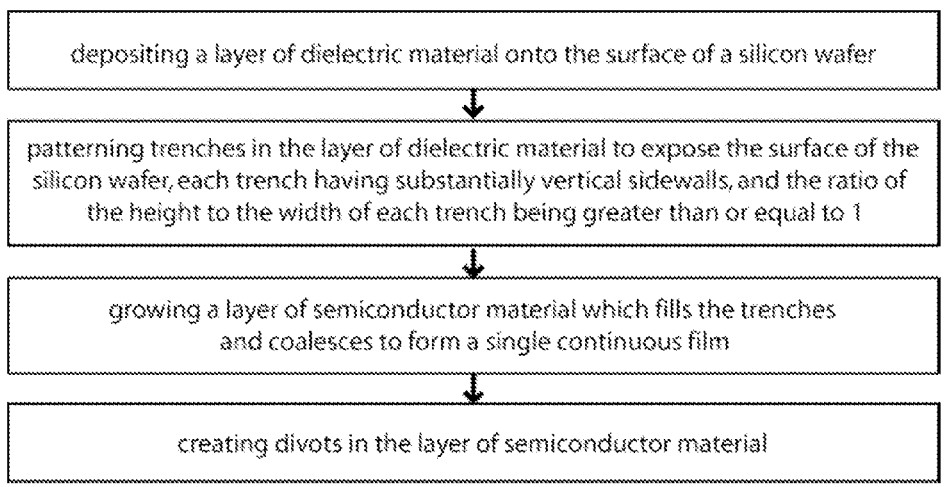
FIG. 23 is a flow chart illustrating the method shown in FIG. 22.

FIG. 22 shows a novel solution: create divots (1150) in the layer of semiconductor material. It would be possible to create these divots by standard techniques, such as lithography, etching, or laser ablation. The divots (1150) effectively limit the area of the coalesced film. As a result, they reduce the thermally induced stresses in the semiconductor material. If the divots have the proper size and spacing, they will allow the semiconductor material to accommodate the thermal stress elastically, without cracking. If the divots have the proper size and spacing, they will allow the semiconductor material to accommodate and largely reduce or eliminate wafer bow. FIG. 23 summarizes this method of reducing the thermally induced stresses in a coalesced film of semiconductor material grown on a silicon substrate by Aspect Ratio Trapping: depositing a layer of dielectric material (1010) onto the surface of a silicon wafer (1000), patterning trenches in the layer of dielectric material (1010) to expose the surface of the silicon wafer (1000), each trench having substantially vertical sidewalls, and the ratio of the height to the width of each trench being greater than or equal to 1, growing a layer of semiconductor material (1030) which fills the trenches and coalesces to form a single continuous film, and creating divots (1150) in the semiconductor material.

In one embodiment, exemplary first divots can extend along a first direction in parallel with a regular, irregular, prescribed, periodic or intermittent spacing, for example, between 0.1 um and 1.0 um. In this manner, the semiconductor material can be made into a plurality of strips or segments. Exemplary second divots similar to the first divots can extend in a second direction (e.g., perpendicular) to the first direction. In this manner, the semiconductor material can be made into a plurality of islands. If the first and second divot patterning was regular and equal, the resulting islands would be squares, however, other known shapes for such islands may be used. In one embodiment, the semiconductor material can include a lower diode region, an active diode region and an upper diode region.

An exemplary method of reducing the thermally induced stresses in coalesced films forming an LED grown on a silicon substrate by Aspect Ratio Trapping (ART) can include: depositing a layer of dielectric material (1010) onto the surface of a silicon wafer (1000), patterning trenches or holes in the layer of dielectric material (1010) to expose the surface of the silicon wafer (1000) with unpatterned lanes or sections between areas filled with patterned trenches or holes, each trench having substantially vertical sidewalls, and the ratio of the height to the width of each trench or hole being sufficient to create a trapping region, and successively growing a coalesced bottom diode region, an active diode region and a top diode region corresponding to the patterned areas within the lanes of unpatterned dielectric material (1010) by standard methods (e.g., MOCVD) to result in divots over the lanes of unpatterned dielectric material (1010).

Figure 23A:
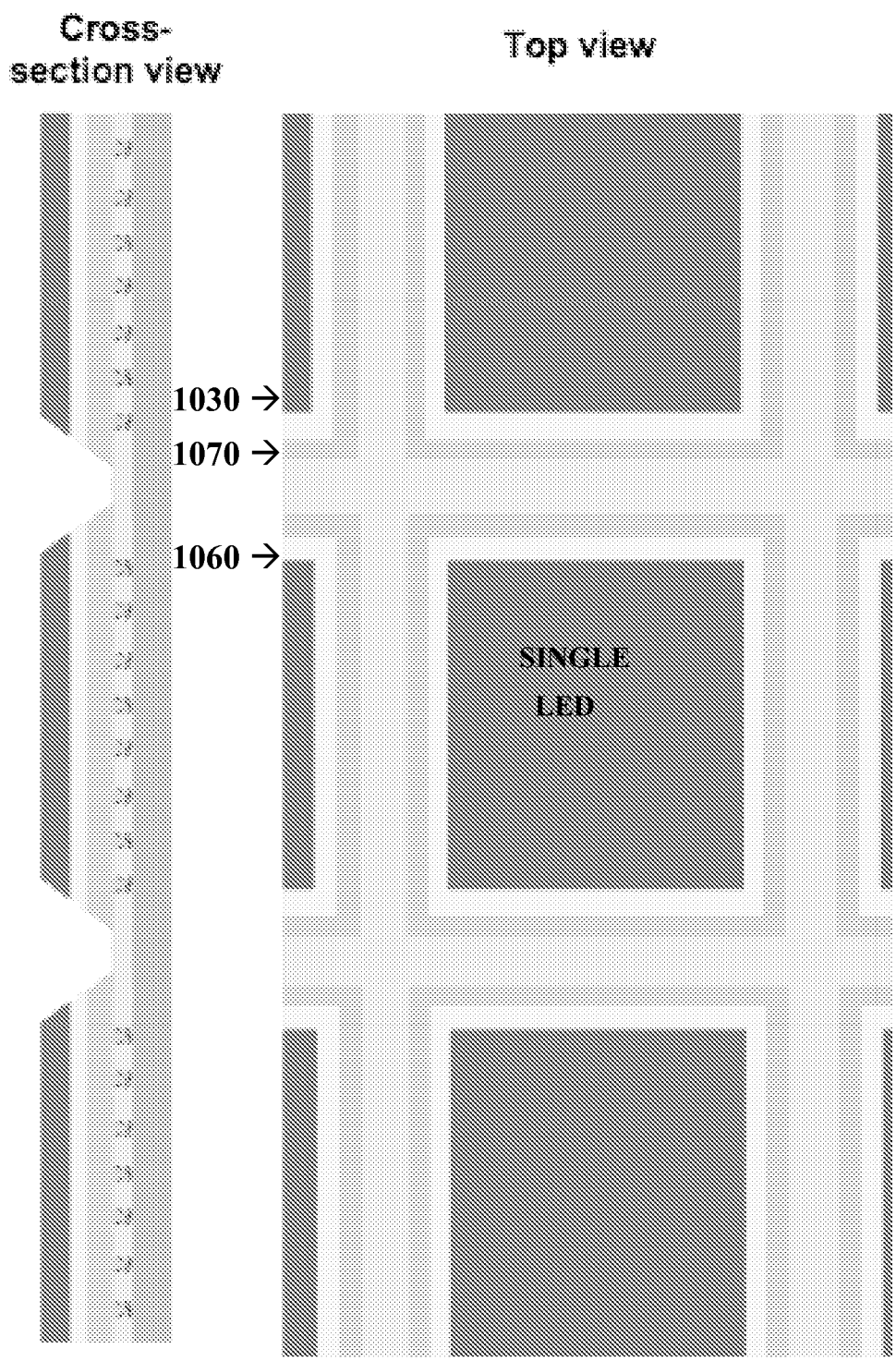
FIG. 23A illustrates exemplary intermediate results from an LED fabrication process.

FIG. 23A illustrates exemplary results from these several steps. Separating (e.g., saw or cleave) individual LEDs corresponding to the divots in the semiconductor material and/or additional steps previously described with respect to the above described first embodiment can result in an alternative embodiment of a LED.

In one embodiment, divots in each lane can occupy 10-30% of a length or width dimension of a corresponding LED. Exemplary divots can include slanted sidewalls at a 45 degree angle to a top surface of an adjacent LED. Alternatively, sidewalls of divots can use a greater or smaller angle such as 30 degrees, 60 degrees, etc.

The active regions for LEDs in a III-N system can be grown over relaxed GaN. For example, such relaxed GaN can be c-plane bulk GaN wafer or substantially relaxed c-plane GaN epilayer grown over a substrate of sapphire or silicon carbide. However, for visible light emission, the emission region must contain a significant fraction of indium. Thus, the emission regions for visible light LEDs in a III-N system have one or more InGaN alloy layers. InGaN has a larger lattice constant than GaN. To avoid or reduce dislocations that accompany relaxation of strained epilayers, such InGaN films remain strained over the underlying GaN layer (e.g., as they are grown to have substantially the same lattice constant as the underlying GaN layer). Further, the c-plane III-N semiconductor materials are polar materials and the strain in the emission region leads to significant polarization fields (e.g., piezoelectric polarization), which can be deleterious to device performance. For example, device/emission efficiency can be degraded or the wavelength of emission can be shifted.

Figure 23B:
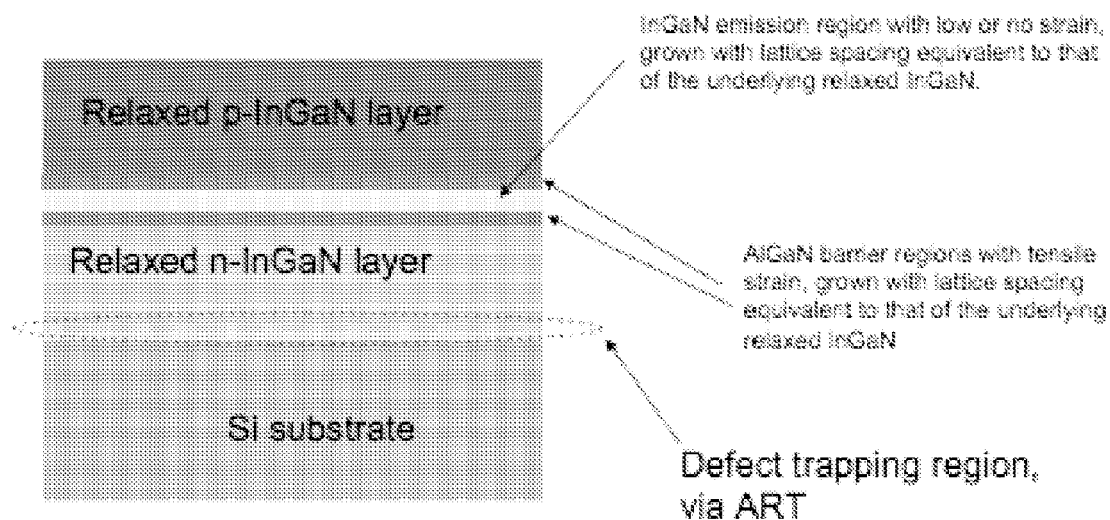
FIG. 23B shows an exemplary diode structure for another embodiment of an LED.

FIG. 23B shows an exemplary diode structure for another embodiment of an LED. In FIG. 23B, at least a portion of a lower diode region close to the substrate comprises InGaN (instead of GaN). The InGaN lower diode region can be a relaxed layer with reduced or controlled defect densities formed using ART techniques. Such an InGaN lower diode region can be a platform for emission regions (e.g., LED emission regions) with significantly reduced strain. For example, further growth of subsequent layers for the active diode region (e.g., InGaN with low or no strain) and upper diode region result in emission regions with significantly reduced strain. As shown in FIG. 23B, a lower diode region is relaxed N-type InGaN over and partially in a defect trapping region, an active diode region is subsequent layers of AlGaN barrier region (e.g., lattice spacing equal to the lower diode region), a reduced strain InGaN emission region and an AlGaN barrier region (e.g., lattice spacing equal to the emission region) In FIG. 23B, the substrate can be a silicon substrate, and contacts to the upper/top and lower/bottom diode regions can be subsequently added (e.g., as described above).

Manufacturers of LEDs have created multi-chip solutions in which they mounted semiconductor chips made of different materials into a single package or module. This technique allows them to combine different colors to achieve white light.

Researchers developing high-efficiency solar cells have created multi-chip solutions in which they mounted semiconductor chips made of different materials into a single package or module. They were implementing a "split spectrum" approach in which they directed a portion of the solar spectrum onto a chip optimized for that portion of the spectrum.

In both of these cases, the costs of mounting and packaging multiple chips may be prohibitively high. We propose a single-chip solution, which has the potential to be much less expensive. For illustrative purposes, we will describe a single chip with three separate diodes.

Figure 24:
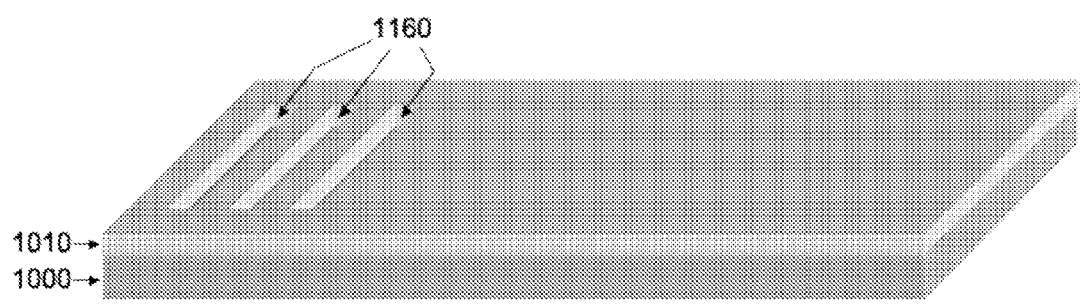
FIG. 24 through 28 illustrate steps in constructing a single chip containing a plurality of diode devices according to a third embodiment.

FIG. 24 shows the first few steps. We deposit a layer of a first dielectric material (1010) onto a silicon substrate (1000). Then we pattern trenches (1160) with substantially vertical sidewalls in a first region of the layer of dielectric material (1010). Each trench exposes the surface of the silicon wafer (1000). The width of each trench should be equal to or less than the thickness of the dielectric material so that the trench can trap threading dislocations.

Optionally, we might then clean the surface of the silicon substrate (1000) at the bottom of the trenches (1160) by the techniques described above.

Figure 25:
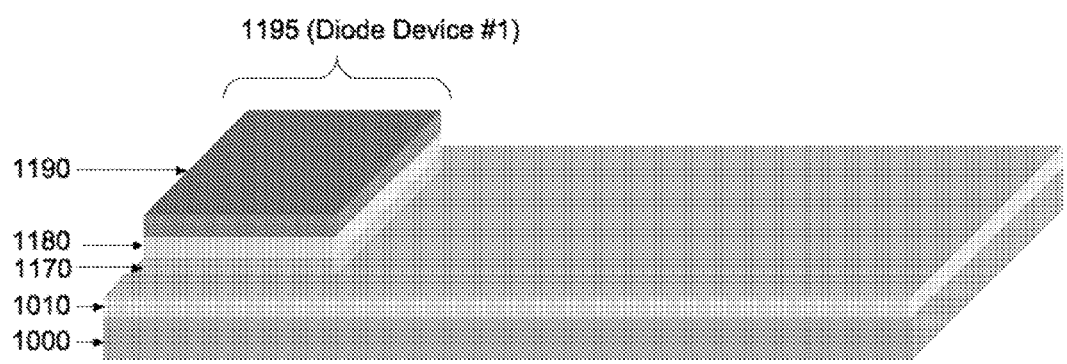

The next step is to mask the top surface of the structure in all locations except the location of diode device number 1 (1195). We then grow the bottom diode region (1170), a layer of semiconductor material which fills the trenches and coalesces to form a single continuous film, as shown in FIG. 25. Exemplary semiconductor materials are described above. Misfit dislocations form at the interface between the bottom diode region (1170) and the silicon substrate (1000). Threading dislocations propagate upward at a 45 degree angle, intersect the sidewalls of the trenches, and terminate within a trapping region.

At this point, it might be useful to planarize the bottom diode region (1170).

Then we grow a layer of semiconductor material to form the active diode region (1180) and yet another layer of semiconductor material to form the top diode region (1190). Together, the bottom diode region (1170), the active diode region (1180), and the top diode region (1190) make up diode device number 1 (1195).

Figure 26:
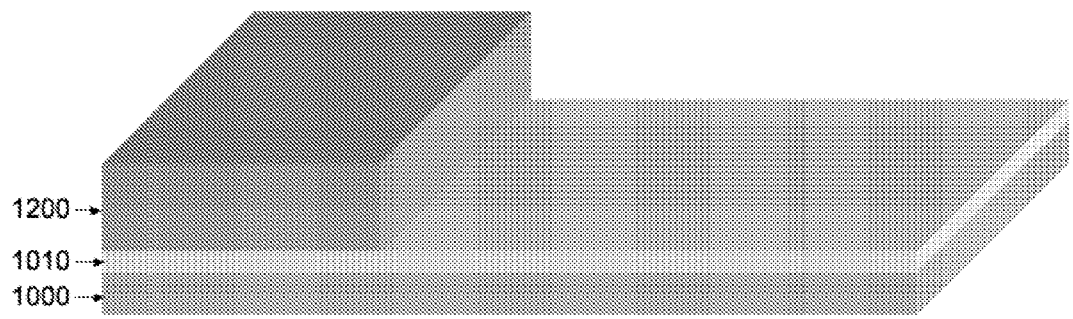

Next we deposit a layer of a second dielectric material (1200). For example, if the first dielectric material was SiO2, the second dielectric material might be SiNx. We selectively remove the second dielectric material (1200) by wet or dry etch from all regions except the region which contains diode device number 1, leaving the structure shown in FIG. 26.

Figure 27:
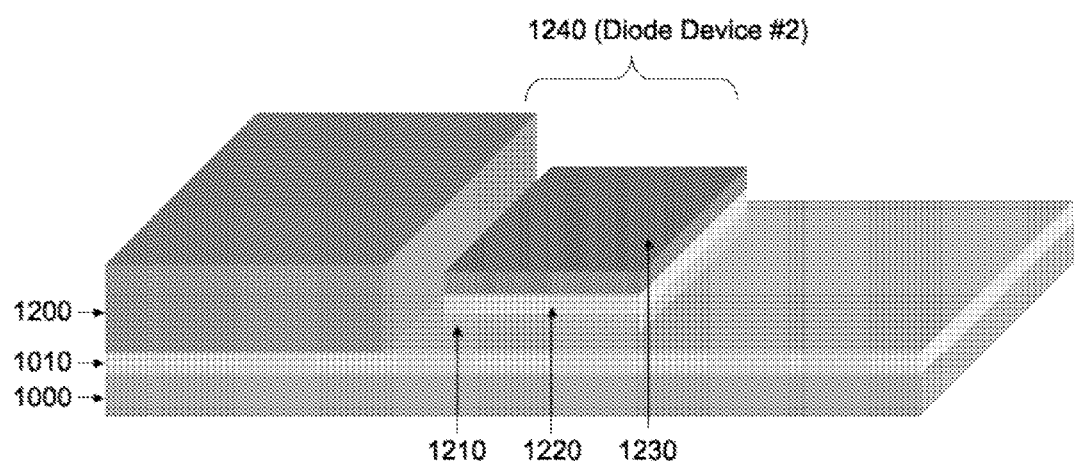

Then we mask the structure in all locations except the location of diode device number 2 (1240). In the next steps, we create diode device number 2, following the same steps by which we created diode device number 1, thereby yielding the structure shown in FIG. 27. As shown in the FIG. 27, a bottom diode region (1210), an active diode region (1220), and a top diode region (1230) make up diode device number 2 (1240).

We deposit another layer of the second dielectric material (1200) to cover diode device number 2 (1240). Then we selectively remove this layer of the second dielectric material (1200) by wet or dry etch from the region which will contain diode device number 3 (1280).

Figure 28:
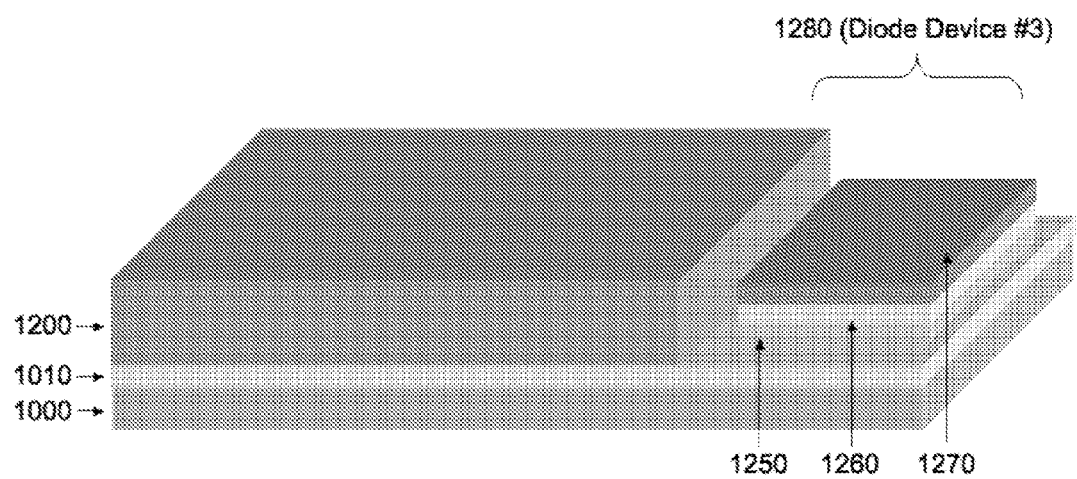

Next we mask the structure in all locations except the location of diode device number 3 (1280) and create diode device number 3 (1280), following the same steps by which we created diode device number 1 (1195) and diode device number 2 (1240). The result is the structure shown in FIG. 28. As shown in the FIG. 28, a bottom diode region (1250), an active diode region (1260), and a top diode region (1270) make up diode device number 3 (1280).

Finally, we cover diode device number 3 (1280) with the second dielectric material (1200), pattern contact vias through the second dielectric material (1200), and deposit individual contacts (1290) on the top of each diode device. We also create a bottom electrical contact (1300) preferably but not necessarily common to all devices on the support substrate (1000).

Figure 29:
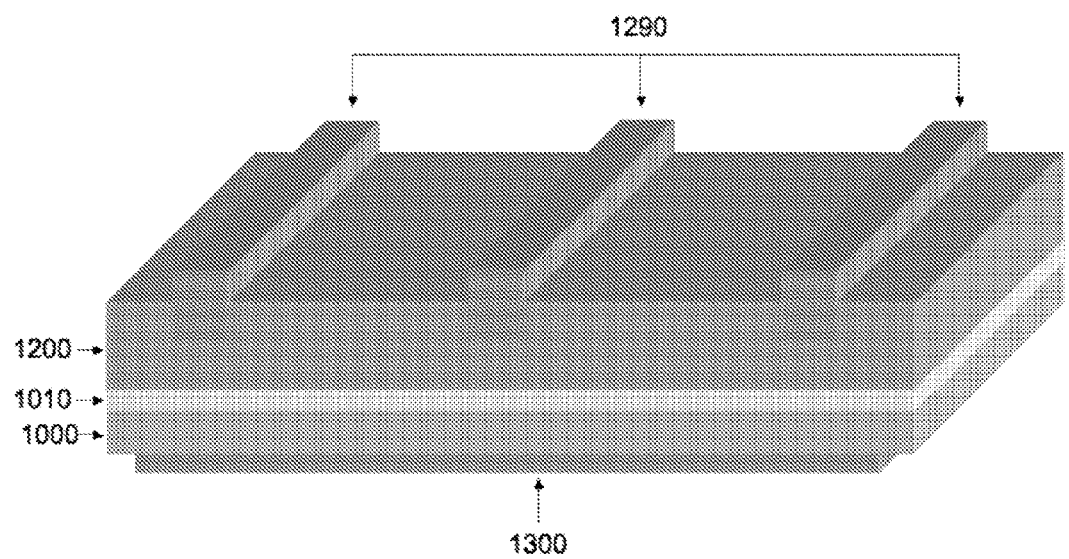
FIG. 29 shows a structure manufactured according to the third embodiment.

The result is shown in FIG. 29. The various diode devices can contain different sets of semiconductor materials for the top, active, and bottom diode regions. In each diode device, the bandgaps of the materials are tailored to emit light of the desired color (in an LED) or to absorb light of the desired frequency (in a solar cell). This embodiment represents a relatively inexpensive way to create multiple diode devices on a single chip.

In summary, a single chip containing a plurality of diode devices, comprising the following elements: a silicon wafer substrate (1000), a layer of a first dielectric material (1010) covering the silicon wafer substrate (1000), this layer of first dielectric material (1010) containing trenches (1160) which expose the surface of the silicon wafer substrate (1000), these trenches (1160) having substantially vertical sidewalls, and the ratio of the height to the width of these trenches (1160) being greater than or equal to 1, a plurality of diode devices (at least three devices 1995, 1240, 1280), each of which comprises a layer of semiconductor material which fills trenches (1160) in one portion of the layer of first dielectric material (1010) and overflows the trenches (1160) to create a bottom diode region (1170, 210, 1250), a trapping region for trapping threading dislocations within the trenches (1160), an active diode region (1180, 1220, 1260), and a top diode region (1190, 1230, 1270), a layer of a second dielectric material (1200) covering the diode devices (1995, 1240, 1280), top electrical contacts (1290), and a bottom electrical contact (1300).

Figure 30:
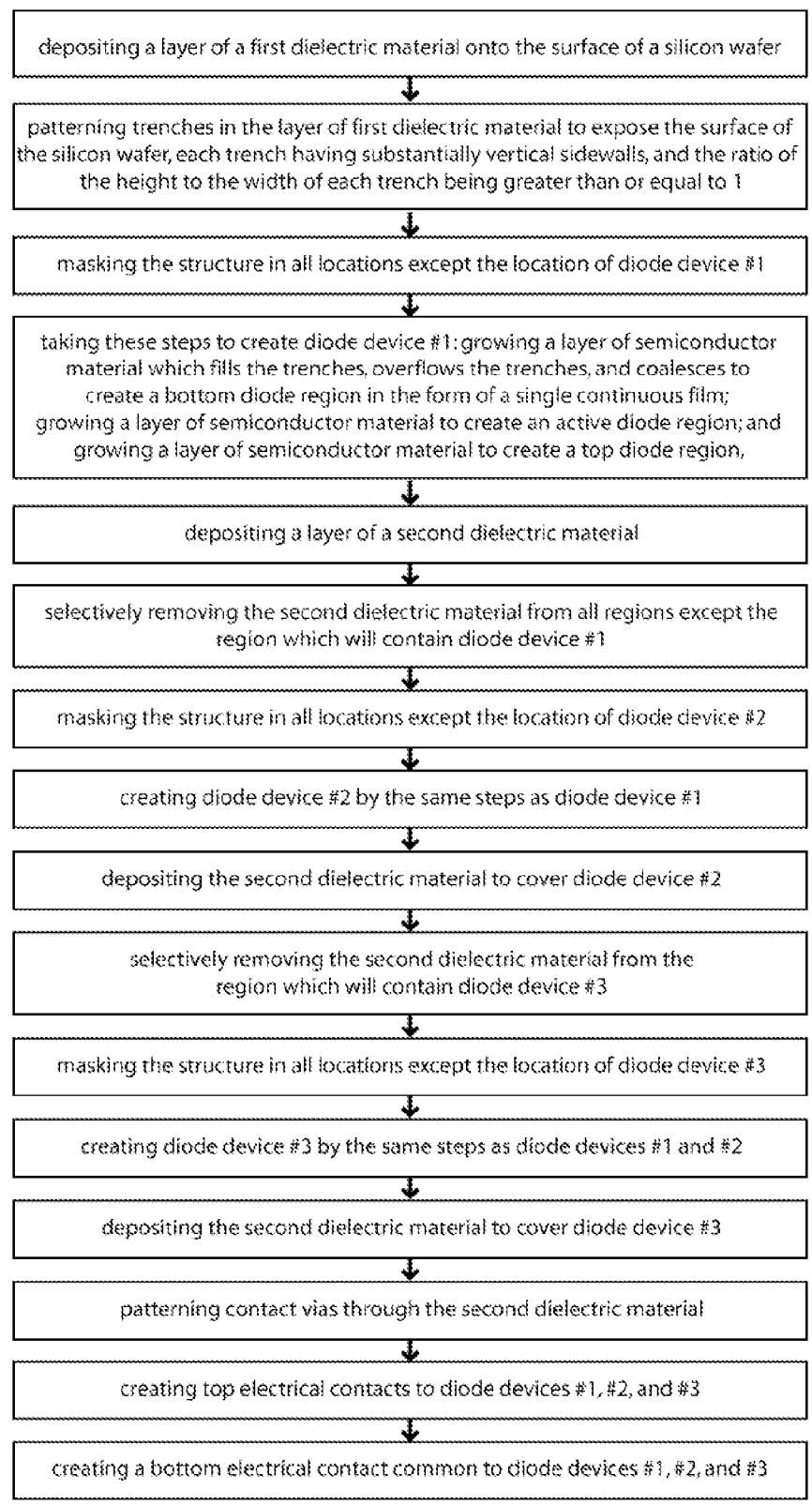
FIG. 30 is a flow chart illustrating a method of creating a structure according to the third embodiment.

FIG. 30 summarizes a method of fabricating the structure shown in FIG. 29. This method of fabricating a plurality of diode devices on a single chip includes these steps:

depositing a layer of a first dielectric material (1010) onto the surface of a silicon wafer (1000), patterning trenches (1160) in the layer of first dielectric material (1010) to expose the surface of the silicon wafer (1000), each trench (1160) having substantially vertical sidewalls, and the ratio of the height to the width of each trench (1160) being greater than or equal to 1, masking the structure in all locations except the location of diode device No. 1 (1195), taking these steps to create diode device No. 1: growing a layer of semiconductor material which fills the trenches, overflows the trenches, and coalesces to create a bottom diode region (1170) in the form of single continuous film; growing a layer of semiconductor material to create an active diode region (1180); and growing a layer of semiconductor material to create a top diode region (1190), depositing a layer of a second dielectric material (1200), selectively removing the second dielectric material (1200) from all regions except the region which contains diode device No. 1 (1195), masking the structure in all locations except the location of diode device No. 2 (1240), creating diode device No. 2 (1240) by the same steps as diode device No. 1 (1195), depositing the second dielectric material (1200) to cover diode device No. 2 (1240), selectively removing the second dielectric material (1200) from the region which will contain diode device No. 3 (1280), masking the structure in all locations except the location of diode device No. 3 (1280), creating diode device No. 3 (1280) by the same steps as diode device No. 1 (1195) and diode device No. 2 (1240), depositing the second dielectric material (1200) to cover diode device No. 3 (1280), patterning contact vias through the second dielectric material (1200), creating top electrical contacts (1290) to diode device No. 1, diode device No. 2, and diode device No. 3, and creating a bottom electrical contact (1300) common to all three diode devices.

It would, of course, be possible to create any number of diode devices on a single chip, the only limitation being the amount of available space.

Embodiments of the application were described using trenches to provide trapping regions, however, alternative structural configurations of recesses with cross-sections functionally sufficient and intended to trap defects may be used herein as "trenches."

Embodiments of the application provide methods, structures or apparatus that may use and/or form by epitaxial growth or the like. For example, exemplary suitable epitaxial growth systems may be a single-wafer or multiple-wafer batch reactor. Various CVD techniques may be used. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or EPSILON single-wafer epitaxial reactors available from ASM International based in Bilthoven, The Netherlands.

Any reference in this specification to "one embodiment," "an embodiment," "example embodiment," "another embodiment," "other embodiments," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

Advantageous embodiments could include a photonic device comprising a substrate, a dielectric material including two or more openings that expose a portion of the substrate, the two or more openings each having an aspect ratio of at least 1, a bottom diode material comprising a compound semiconductor material that is lattice mismatched to the substrate, and wherein the compound semiconductor material occupies the two or more openings and is coalesced above the two or more openings to form the bottom diode region, a top diode material, and an active diode region between the top and bottom diode materials. The substrate could be selected from the group consisting of silicon, sapphire, and silicon carbide. The substrate could be a single crystal silicon wafer. The single crystal silicon wafer could have a crystal orientation of (111) or (100). The active diode region could comprise a p-n junction formed by a junction of the top and bottom diode materials. The active diode region could comprise a material different from the top and bottom diode materials, and could form an intrinsic region of a p-i-n junction formed between the top and bottom diode materials. The active diode region could comprise multiple quantum wells formed between the top and bottom diode materials. The dielectric material could comprise a material selected from the group consisting essentially of silicon dioxide, silicon nitride, silicon oxynitride, oxides of hafnium, silicates of hafnium, oxides of zirconium, silicates of zirconium, and combinations thereof. The opening could be a trench or could be a hole having an aspect ratio of at least 1 in two perpendicular axes. The semiconductor material could comprise a Group III-V compound, a Group II-VI compound, or a Group IV alloy. The bottom diode material could include an n-type dopant and the top diode material could include a p-type dopant. The device could further include a contact formed over the top diode region. The contact could be a transparent conductor. The device could yet further include a second contact formed adjacent the substrate.

Another advantageous embodiment could include a photonic device having a substrate, and a photonic diode comprising a first region proximate a top surface of the substrate, a second region proximate the first region, and an active region between the first and second regions, wherein the second region includes a surface adjacent the active region, the surface being generally parallel to the substrate top surface, and the second region includes at least one defect-trapping region spaced apart from the active region, the defect trapping region including a surface that extends away from the substrate top surface. The surface of the first diode region could be bonded to a handle substrate. An intermediate layer could be bonded to the handle substrate between the first diode region and the handle substrate. The handle substrate could include a conductor electrically connected to the first diode region. The device could further include a contact connected to the handle substrate and in electrical communication with the first diode region.

Another advantageous embodiment includes a method of making a photonic device. The method could include depositing a layer of a dielectric material onto a substrate, patterning two or more openings in the dielectric material to expose portions of the surface of the substrate, the two or more openings having an aspect ratio of at least 1, forming a bottom diode region by growing a compound semiconductor material that is lattice mismatched to the substrate in the two or more openings and allowing the compound semiconductor material to fill in the two or more openings and coalesce above the two or more openings to form a continuous layer, forming an active diode region on the bottom diode region, and forming a top diode region on the active diode region. The method could further include bonding a handle wafer to the top diode region and removing the substrate.

Another advantageous embodiment could provide for a photonic device having a bottom diode region including two or more threading dislocation trapping regions and comprised of a compound semiconductor material, an active diode region, a top diode region, a handle substrate, a first electrical contact in communication with the handle substrate, and a second electrical contact in communication with the bottom diode region.

Yet another advantageous embodiment could provide for a method of making a photonic device comprising depositing a layer of a dielectric material onto a substrate, patterning two or more openings in the dielectric material to expose portions of the surface of the substrate, the two or more openings having an aspect ratio of at least 1, forming a bottom diode region by growing a compound semiconductor material that is lattice mismatched to the substrate in the two or more openings and allowing the compound semiconductor material to fill in the two or more openings and coalesce above the two or more openings to form a continuous layer, forming an active diode region on the bottom diode region, forming a top diode region on the active diode region, bonding a handle wafer to the top diode region, removing the substrate, removing the dielectric material, contacting a first electrical contact with the handle substrate, and contacting a second electrical contact with the bottom diode region.

Still another advantageous embodiment includes a method of making a structure comprising a semiconductor material bonded to a substrate. The method could include depositing a layer of a dielectric material onto a substrate, patterning two or more openings in the dielectric material to expose portions of the surface of the substrate, the two or more openings having an aspect ratio of at least 1, growing a layer of a compound semiconductor material that is lattice mismatched to the substrate in the two or more openings and allowing the semiconductor material to fill in the two or more openings and coalesce above the two or more openings to form a continuous layer, implanting ions into the semiconductor material to create a cleavage plane, bonding a handle substrate to the semiconductor material, and cleaving the layer of semiconductor material at the cleavage plane.

In some aspect, advantageous embodiments could provide for a chip including a plurality of discrete photonic devices thereon. The chip could include a substrate, a first dielectric material layer covering the substrate and having a plurality of openings therein having an aspect ratio of at least 1, a plurality of discrete photonic devices, each discrete photonic device comprising (i) a layer of semiconductor material that is mismatched to the substrate that occupies at least two openings and is coalesced above the occupied openings to form a single bottom diode region, (ii) an active diode region, and (iii) a top diode region, a second layer of dielectric material covering the plurality of discrete photonic devices, at least one top electrical contact; and at least one bottom electrical contact.

Yet another advantageous method could provide for a method of making a chip including a plurality of discrete photonic devices thereon comprising depositing a layer of a dielectric material onto a substrate, patterning a first set of openings in the dielectric material to expose portions of the surface of the substrate, the first set of openings having an aspect ratio of at least 1, forming a first bottom diode region by growing a layer of a semiconductor material that is lattice mismatched to the substrate in the first set of openings and allowing the semiconductor material to fill in the first set of openings and coalesce above the first set of openings to form a continuous layer, forming a first active diode region on the first bottom diode region, forming a first top diode region on the first active diode region, growing a layer of dielectric material to cover the first bottom diode region, first active diode region, and first top diode region, patterning a second set of openings in the dielectric material to expose portions of the surface of the substrate, the second set of openings having an aspect ratio of at least 1, forming a second bottom diode region by growing a layer of a semiconductor material that is lattice mismatched to the substrate in the second set of openings and allowing the semiconductor material to fill in the second set of openings and coalesce above the second set of openings to form a continuous layer, forming a second active diode region on the second bottom diode region, forming a second top diode region on the second active diode region, and growing a layer of dielectric material to cover the second bottom diode region, second active diode region, and second top diode region. The method could further include contacting a first electrical contact with the substrate, contacting a second electrical contact with first top diode region, and contacting a third electrical contact with the second top diode region.

What is claimed is:

1. A method comprising:
   depositing a layer of a dielectric material onto a substrate;
   patterning two or more openings in the dielectric material to expose respective portions of a surface of the substrate, the two or more openings having an aspect ratio of at least 1;
   forming a bottom diode region by growing a compound semiconductor material that is lattice mismatched to a crystalline material of the substrate in the two or more openings, the compound semiconductor material adjoining the crystalline material, and allowing the compound semiconductor material to fill the two or more openings and coalesce above the two or more openings to form a continuous layer;
   forming an active diode region on the bottom diode region; and
   forming a top diode region on the active diode region.

2. The method of claim 1 further comprising:
   bonding a handle substrate to the top diode region; and
   removing the substrate.

3. The method of claim 1 further comprising:
   implanting ions into the continuous layer of the compound semiconductor material to create a cleavage plane;
   bonding a handle substrate to the continuous layer of the compound semiconductor material; and
   cleaving the continuous layer of the compound semiconductor material at the cleavage plane.

4. The method of claim 1 further comprising forming a divot in the continuous layer of the compound semiconductor material.

5. The method of claim 1, wherein the continuous layer of the compound semiconductor material has a dislocation density less than or equal to $10^8$ cm$^{-2}$.

6. The method of claim 1, wherein the compound semiconductor material comprises dislocations, the dislocations terminating at respective sidewalls of the openings.

7. The method of claim 1 further comprising:
   masking the top diode region, the active diode region, and the bottom diode region; and
   while the top diode region, the active diode region, and the bottom diode region are masked:
      patterning two or more additional openings in the dielectric material to expose respective portions of the surface of the substrate;
      forming an additional bottom diode region by growing an additional compound semiconductor material in the two or more additional openings and allowing the additional compound semiconductor material to fill the two or more additional openings and coalesce above the two or more additional openings to form an additional continuous layer;
      forming an additional active diode region on the additional bottom diode region; and
      forming an additional top diode region on the additional active diode region.

8. A method comprising:
   depositing a layer of a dielectric material on a substrate;

patterning two or more openings in the dielectric material to expose portions of a surface of the substrate, the two or more openings having an aspect ratio of at least 1;
forming a bottom diode region by:
  growing a compound semiconductor material in the two or more openings, the compound semiconductor material being lattice mismatched to a crystalline material of the substrate in the portions of the surface of the substrate, and
  growing the compound semiconductor material to coalesce above a top surface of the dielectric material between the two or more openings to form a continuous layer;
forming an active diode region on the bottom diode region;
forming a top diode region on the active diode region;
bonding a handle substrate to the top diode region; and
removing the substrate.

9. The method of claim 8 further comprising removing the dielectric material.

10. The method of claim 8 further comprising:
contacting a first electrical contact with the handle substrate; and
contacting a second electrical contact with the bottom diode region.

11. The method of claim 8, wherein the removing the substrate comprises cleaving the continuous layer at a cleavage plane.

12. The method of claim 8, wherein the removing the substrate comprises grinding the substrate.

13. The method of claim 8, wherein the continuous layer of the compound semiconductor material has a dislocation density less than or equal to $10^8$ cm$^{-2}$.

14. The method of claim 8, wherein the compound semiconductor material comprises dislocations, the dislocations terminating at respective sidewalls of the openings.

15. A method comprising:
depositing a layer of dielectric material on a substrate;
patterning a first set of openings in the layer of dielectric material to expose first portions of a surface of the substrate, the first set of openings having an aspect ratio of at least 1;
forming a first bottom diode region by growing a first semiconductor material that is lattice mismatched to a crystalline material of the substrate in the first set of openings and growing the first semiconductor material to coalesce above the layer of dielectric material and between respective ones of the first set of openings to form a first continuous layer;
forming a first active diode region on the first bottom diode region;
forming a first top diode region on the first active diode region;
masking the first bottom diode region, first active diode region, and first top diode region;
patterning a second set of openings in the layer of dielectric material to expose second portions of the surface of the substrate, the second set of openings having an aspect ratio of at least 1;
forming a second bottom diode region by growing a second semiconductor material that is lattice mismatched to the crystalline material of the substrate in the second set of openings and growing the second semiconductor material to coalesce above the layer of dielectric material and between respective ones of the second set of openings to form a second continuous layer;
forming a second active diode region on the second bottom diode region; and
forming a second top diode region on the second active diode region.

16. The method of claim 15 further comprising:
contacting a first electrical contact with the substrate;
contacting a second electrical contact with first top diode region; and
contacting a third electrical contact with the second top diode region.

17. The method of claim 15, wherein the first semiconductor material and the second semiconductor material are different materials.

18. The method of claim 15, wherein a bandgap of the first active diode region is different from a bandgap of the second active diode region.

19. The method of claim 15, wherein the first semiconductor material comprises first dislocations arising from the lattice mismatch with the crystalline material of the substrate, the first dislocations terminating at respective first sidewalls of the first set of openings, and wherein the second semiconductor material comprises second dislocations arising from the lattice mismatch with the crystalline material of the substrate, the second dislocations terminating at respective second sidewalls of the second set of openings.

20. The method of claim 15, wherein each of the first continuous layer and the second continuous layer has a dislocation density less than or equal to $10^8$ cm$^{-2}$.

* * * * *